(12) United States Patent
Ikeda

(10) Patent No.: US 11,869,886 B2
(45) Date of Patent: Jan. 9, 2024

(54) ESD PROTECTION CIRCUIT, SEMICONDUCTOR DEVICE, AND ELECTRONIC APPARATUS

(71) Applicant: Seiko Epson Corporation, Tokyo (JP)

(72) Inventor: Masuhide Ikeda, Matsumoto (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/751,716

(22) Filed: May 24, 2022

(65) Prior Publication Data

US 2022/0384420 A1 Dec. 1, 2022

(30) Foreign Application Priority Data

May 25, 2021 (JP) ................ 2021-087426

(51) Int. Cl.
*H01L 27/02* (2006.01)
*H02H 9/04* (2006.01)

(52) U.S. Cl.
CPC ........ *H01L 27/0266* (2013.01); *H02H 9/046* (2013.01)

(58) Field of Classification Search
CPC .. H01L 27/0266; H01L 27/0285; H02H 9/046
USPC .......................................................... 361/56
See application file for complete search history.

(56) References Cited

U.S. PATENT DOCUMENTS

| 9,025,289 B1* | 5/2015 | Peng | H02H 9/046 |
| | | | 361/118 |
| 10,693,292 B2* | 6/2020 | Tang | H02H 9/041 |
| 11,482,858 B2* | 10/2022 | Watanabe | H01L 27/0292 |
| 11,527,530 B2* | 12/2022 | Mysore Rajagopal | |
| | | | H01L 27/0266 |
| 2006/0250735 A1* | 11/2006 | Kwon | H01L 27/0266 |
| | | | 361/56 |
| 2007/0070563 A1* | 3/2007 | Ma | H01L 27/0255 |
| | | | 361/56 |
| 2009/0141415 A1* | 6/2009 | Moon | H02H 9/046 |
| | | | 361/56 |
| 2011/0195744 A1* | 8/2011 | Zhang | H02H 11/003 |
| | | | 361/84 |
| 2012/0120531 A1* | 5/2012 | Abou-Khalil | H02H 9/046 |
| | | | 361/56 |

(Continued)

FOREIGN PATENT DOCUMENTS

| JP | 2010278188 A | * 12/2010 | ........ H01L 27/0251 |
| JP | 2015-029251 A | 2/2015 | |
| JP | 2016119388 A | * 6/2016 | |

*Primary Examiner* — Dharti H Patel

(74) *Attorney, Agent, or Firm* — Harness, Dickey & Pierce, P.L.C.

(57) ABSTRACT

An ESD protection circuit includes a power MOS transistor disposed between a first line and a second line, a clamp circuit disposed between the first line and a first node to which a gate of the power MOS transistor is coupled, a first resistor disposed between the first node and the second line, a MOS transistor disposed between the first node and the second line, a third line supplied with a third potential generated by a constant-voltage circuit of the protection target circuit, and a second resistor and a first capacitor coupled in series between a second node coupled to the third line and the second line, wherein when defining a junction between the second resistor and the first capacitor as a third node, a gate of the MOS transistor is coupled to the third node.

11 Claims, 17 Drawing Sheets

(56) References Cited

U.S. PATENT DOCUMENTS

| | | | | |
|---|---|---|---|---|
| 2012/0154960 A1* | 6/2012 | Tsai | ............... | H02H 9/046 |
| | | | | 361/56 |
| 2012/0212869 A1* | 8/2012 | Shimomura | ........... | H02H 9/046 |
| | | | | 361/56 |
| 2013/0188286 A1* | 7/2013 | Wang | ............... | H02H 9/046 |
| | | | | 361/56 |
| 2013/0222954 A1* | 8/2013 | Demange | ............ | H01L 27/0285 |
| | | | | 361/56 |
| 2015/0002965 A1* | 1/2015 | Hayashi | ............. | H01L 27/0266 |
| | | | | 361/56 |
| 2016/0172846 A1* | 6/2016 | Kotani | ............... | H02H 9/04 |
| | | | | 361/56 |
| 2017/0179106 A1* | 6/2017 | Ikeda | ................ | H01L 27/0251 |

* cited by examiner

ESD PROTECTION CIRCUIT, SEMICONDUCTOR DEVICE, AND ELECTRONIC APPARATUS

The present application is based on, and claims priority from JP Application Serial Number 2021-087426, filed May 25, 2021, the disclosure of which is hereby incorporated by reference herein in its entirety.

BACKGROUND

1. Technical Field

The present disclosure relates to an ESD protection circuit, and a semiconductor device and an electronic apparatus each equipped with the ESD protection circuit.

2. Related Art

There is known a semiconductor device equipped with an ESD (Electro-Static Discharge) protection circuit which absorbs an ESD voltage to prevent breakage of a protection target circuit. In, for example, FIG. 2A of JP-A-2015-29251 (Document 1), there is disclosed the ESD protection circuit. FIG. 17 shows an ESD protection circuit 90 based on a circuit diagram of Document 1. It should be noted that a zener diode is coupled in parallel to a resistor 113 in FIG. 2A of Document 1, but is omitted in FIG. 17. This is because when a gate insulator film of a power transistor 111 formed of a power MOS transistor and the resistor 113 are sufficiently resistant to the possible ESD voltage, the zener diode is not essential as described in Document 1.

According to the ESD protection circuit 90 shown in FIG. 17, when the ESD voltage is applied to a first line 105 which is a power line at a high potential side of a protection target circuit 80, when a voltage of the first line 105 rises, and a gate-drain voltage of the power transistor 111 exceeds a predetermined clamp voltage, a clamp circuit 112 breaks down. On this occasion, a breakdown current flows through the resistor 113 to cause a voltage drop. Thus, the gate-source voltage of the power transistor 111 rises, and the power transistor 111 turns ON, the voltage of the first line 105 is clamped around the predetermined clamp voltage to prevent further rise in voltage. Thus, an overvoltage is prevented from being applied to the protection target circuit 80. It should be noted that the resistor 113 is a pull-down resistor for the power transistor 111.

However, when increasing the resistance value of the pull-down resistor, it is possible to decrease the clamp voltage, but on the other hand, there is a problem that the power transistor 111 becomes apt to turn ON in an unintended manner due to external noise during operation. Further, by contraries, when decreasing the resistance value of the pull-down resistor, a reaction to the noise including a high-frequency signal component becomes difficult to occur, but the clamp voltage increases to make a potential difference between a maximum operating voltage and the breakdown voltage of the protection target circuit 80 small, and there is a problem that it is unachievable to protect the protection target circuit 80 from static electricity when a high ESD voltage is applied. In other words, in the ESD protection circuit 90 of the related art, there is a problem that it is difficult to achieve both of a noise tolerance during operation of the protection target circuit 80, and a breakdown voltage performance with respect to the ESD voltage.

SUMMARY

An ESD protection circuit according to the present disclosure is an ESD protection circuit which is disposed between a first line configured to supply a first potential and a second line configured to supply a second potential different from the first potential, and protects a protection target circuit from a surge voltage, the ESD protection circuit including a power MOS transistor disposed between the first line and the second line, a clamp circuit disposed between the first line and a first node to which a gate of the power MOS transistor is coupled, a first resistor disposed between the first node and the second line, a MOS transistor disposed between the first node and the second line, a third line supplied with a third potential generated by a constant-voltage circuit of the protection target circuit, and a second resistor and a first capacitor coupled in series between a second node coupled to the third line and the second line, wherein when defining a junction between the second resistor and the first capacitor as a third node, a gate of the MOS transistor is coupled to the third node, and the third potential is a potential between the first potential and the second potential.

A semiconductor device includes the ESD protection circuit described above.

An electronic apparatus includes the semiconductor device described above.

DESCRIPTION OF EXEMPLARY EMBODIMENTS

Embodiment 1

Basic Circuit of ESD Protection Circuit

Figure 1:
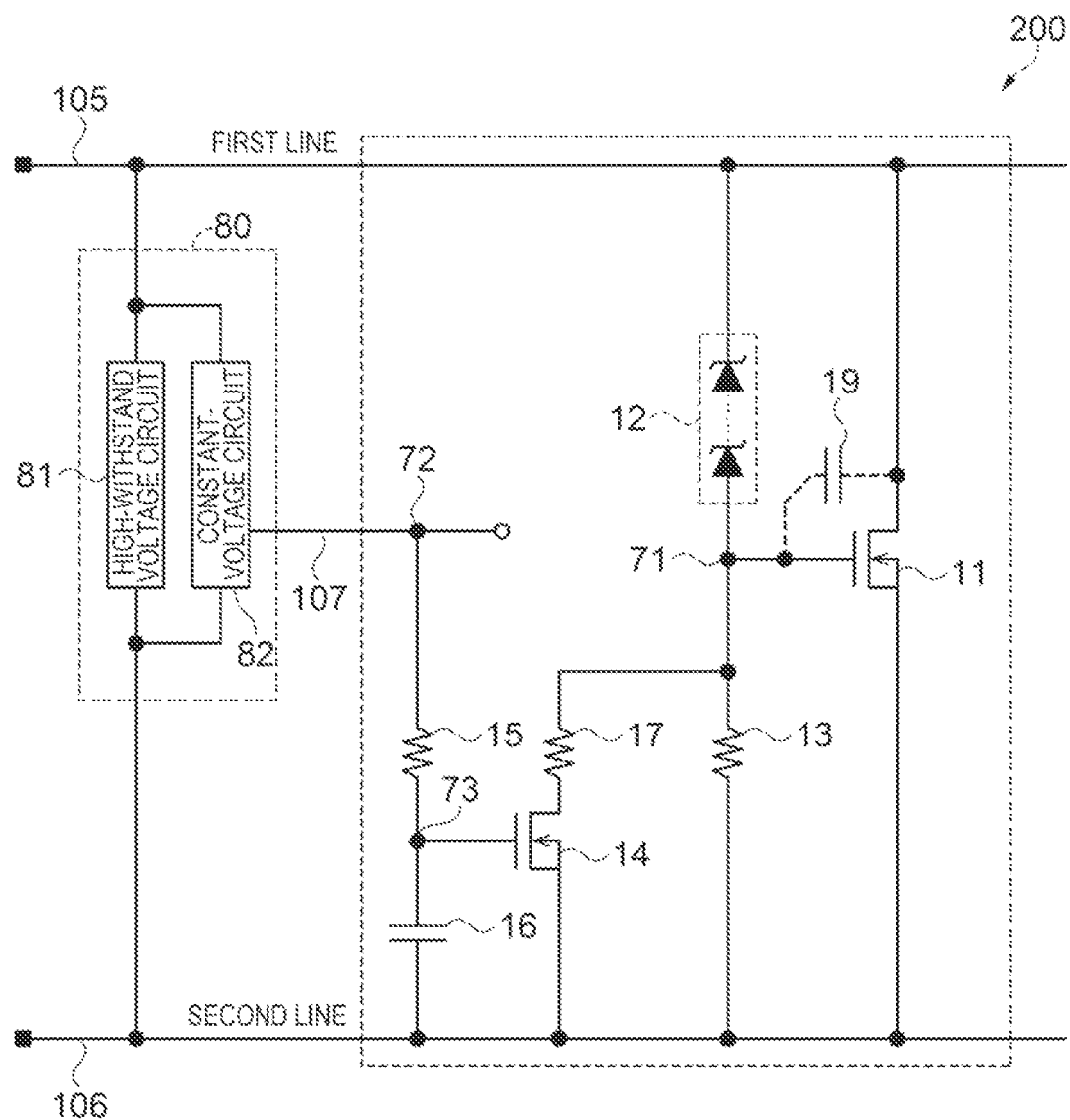
FIG. 1 is a circuit diagram of an ESD protection circuit according to Embodiment 1.

FIG. 1 is a circuit diagram of an ESD projection circuit according to Embodiment 1.

The ESD protection circuit 200 according to the present embodiment is a protection circuit for protecting a protection target circuit 80 from an ESD voltage.

The protection target circuit 80 is a semiconductor device such as an IC (Integrated Circuit), and is configured including a high-withstand voltage circuit 81 and a constant-voltage circuit 82. To the protection target circuit 80, there are electrically coupled a first line 105 and a second line 106 as power-supply lines. The first line 105 supplies a first potential, and the second line 106 supplies a second potential different from the first potential. The description will be presented assuming that, for example, the second line 106 supplies a low potential of 0 V as the second potential, and the first line 105 supplies a high potential of 45 V as the first potential. Further, a maximum operating voltage of the high-withstand voltage circuit 81 is assumed as 45 V, and a breakdown voltage of the protection target circuit 80 is assumed as 55 V. The constant-voltage circuit 82 is a constant-voltage generating circuit including a DC-DC converter, and supplies, for example, a potential of 5 V to a third line 107 as a third potential which is a potential between the first potential and the second potential. It should be noted that these potentials and voltages are not a limitation, and can arbitrarily be changed in accordance with a rated operating voltage of the protection target circuit 80 and so on.

The ESD protection circuit 200 is disposed between the first line 105 and the second line 106, and is constituted by a power transistor 11, a clamp circuit 12, a resistor 13, a transistor 14, a resistor 15, a capacitor 16, a resistor 17, and so on.

The power transistor 11 is a field-effect type N-channel power MOS (Metal Oxide Semiconductor) transistor. The source of the power transistor 11 is coupled to the second line 106, and the drain thereof is coupled to the first line 105. It should be noted that "coupling" means "electrical coupling." The same applies also to the following description. It should be noted that in FIG. 1, a parasitic capacitance between the gate and the drain of the power transistor 11 is illustrated with dotted lines as a capacitor 19.

The clamp circuit 12 is constituted by a plurality of zener diodes coupled in series to one another, wherein an anode side is coupled to the gate of the power transistor 11, and a cathode side is coupled to the first line 105. Further, a node between the gate of the power transistor 11 and the clamp circuit 12 is defined as a first node 71. In other words, the clamp circuit 12 is disposed between the first line 105 and the first node 71.

The resistor 13 is a first resistor, and is disposed between the first node 71 and the second line 106.

The resistor 14 is an N-channel MOS transistor, and is disposed between the first node 71 and the second line 106. The source of the transistor 14 is coupled to the second line 106.

The resistor 15 is a second resistor, wherein one end thereof is coupled to a second node 72 of the third line 107, and the other end is coupled to one end of the capacitor 16.

The capacitor 16 is a first capacitor, and the other end thereof is coupled to the second line 106. In other words, the resistor 15 and the capacitor 16 are coupled in series between the second node 72 and the second line 106 in this order.

Further, when defining a junction between the resistor 15 and the capacitor 16 as a third node 73, the gate of the transistor 14 is coupled to the third node 73.

The resistor 17 is a third resistor, and is disposed between the first node 71 and the drain of the transistor 14.

According to this circuit configuration, by switching the transistor 14 in accordance with operation/non-operation of the protection target circuit 80, it is possible to switch a pull-down resistance value of the power transistor 11. It should be noted that the details thereof will be described later.

Voltage-Current Characteristic in ESD Protection Circuit

Figure 2:
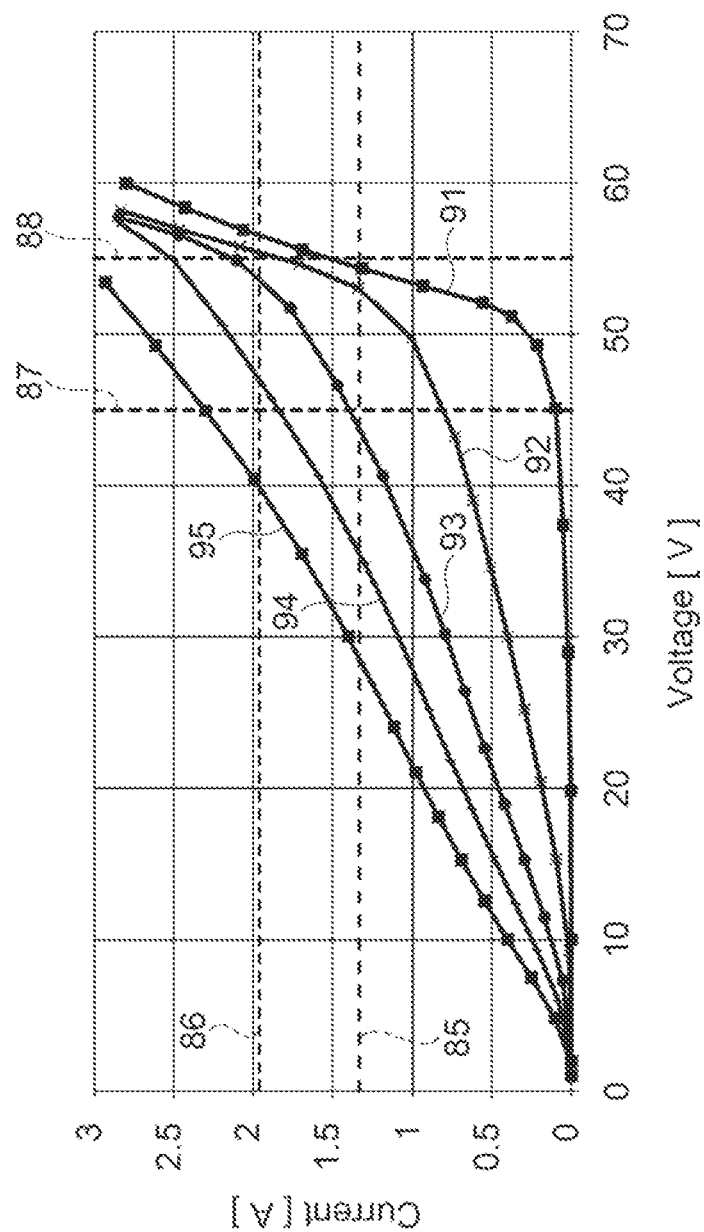
FIG. 2 is a graph chart showing a voltage-current characteristic in the ESD protection circuit.

FIG. 2 is a graph chart showing a voltage-current characteristic in the ESD protection circuit.

Here, the voltage-current characteristic in the ESD protection circuit 90 of the related art shown in FIG. 17 will be described with reference also to FIG. 2. In the graph shown in FIG. 2, the horizontal axis represents a drain voltage [V] of the power transistor 111, and the vertical axis represents a drain current [A].

FIG. 2 shows a simulation result of the voltage-current characteristic when applying an ESD pulse when varying the resistance value of the resistor 113 as a pull-down resistor for the power transistor 111. It should be noted that the present simulation is based on a TLP (Transmission Line Pulse) measurement.

A graph 91 shown in FIG. 2 represents the voltage-current characteristic when the pull-down resistance is 2 kΩ. Similarly, a graph 92 represents the voltage-current characteristic when the pull-down resistance is 5 kΩ, a graph represents the voltage-current characteristic when the pull-down resistance is 10 kΩ, a graph 94 represents the voltage-current characteristic when the pull-down resistance is 20 kΩ, and a graph 95 represents the voltage-current characteristic when the pull-down resistance is 100 kΩ.

Further, a line segment 85 represents 1.33 A as a peak current when the ESD pulse is at 2,000 V. A line segment 86 represents 1.93 A as a peak current when the ESD pulse is at 3,000 V. Further, a line segment 87 represents 45 V as a maximum operating voltage of the high-withstand voltage circuit 81. A line segment 88 represents 55 V as a breakdown voltage of the protection target circuit 80.

As shown in the graph 91, it is understood that when the pull-down resistance is as low as 2 kΩ, the drain current hardly flows until the drain voltage becomes around 45 V. This shows the fact that the tolerance to a noise from the first line 105 and the second line 106 as the power supply lines is high. On the other hand, when applying the ESD pulse of 3,000 V, the drain voltage exceeds the line segment 88 representing the breakdown voltage 55 V of the protection target circuit 80, and thus, it is understood that the ESD breakdown voltage performance is insufficient. Particularly, an intersection point between the line segment 86 representing the peak current 1.93 A when applying 3,000 V and the graph 91 exceeds the line segment 88.

On the other hand, it is understood that when the pull-down resistance is as high as 100 kΩ, the drain current also increases substantially in proportion to the rise in drain voltage as represented by the graph 95. This shows the fact that the tolerance to the noise from the first line 105 and the second line 106 as the power supply lines is low. When the noise tolerance is low, there is a possibility that the power transistor 111 malfunctions due to the noise from the outside during the operation of the protection target circuit 80. On the other hand, even when applying the ESD pulse of 3,000 V, there is no chance for the drain voltage to exceed the line segment 88 representing the breakdown voltage 55 V of the protection target circuit 80, and thus, it is understood that the ESD breakdown voltage performance is high. Particularly, an intersection point between the line segment 86 representing the peak current 1.93 A when applying 3,000 V and the graph 95 does not reach the line segment 88.

It should be noted that the reason that the drain current flows is as follows. When the drain voltage of the power transistor 111 starts to rise, the high-frequency component thereof flows to the resistor 113 through a capacitor 119 as a parasitic capacitance to cause a voltage drop, and thus, the gate-source voltage of the power transistor 111 also starts to increase. Then, since the ON resistance of the power transistor 111 starts to decrease, a current starts to flow between the source and the drain of the power transistor 111.

Result of Simulation by HBM Testing Method

Figure 3:
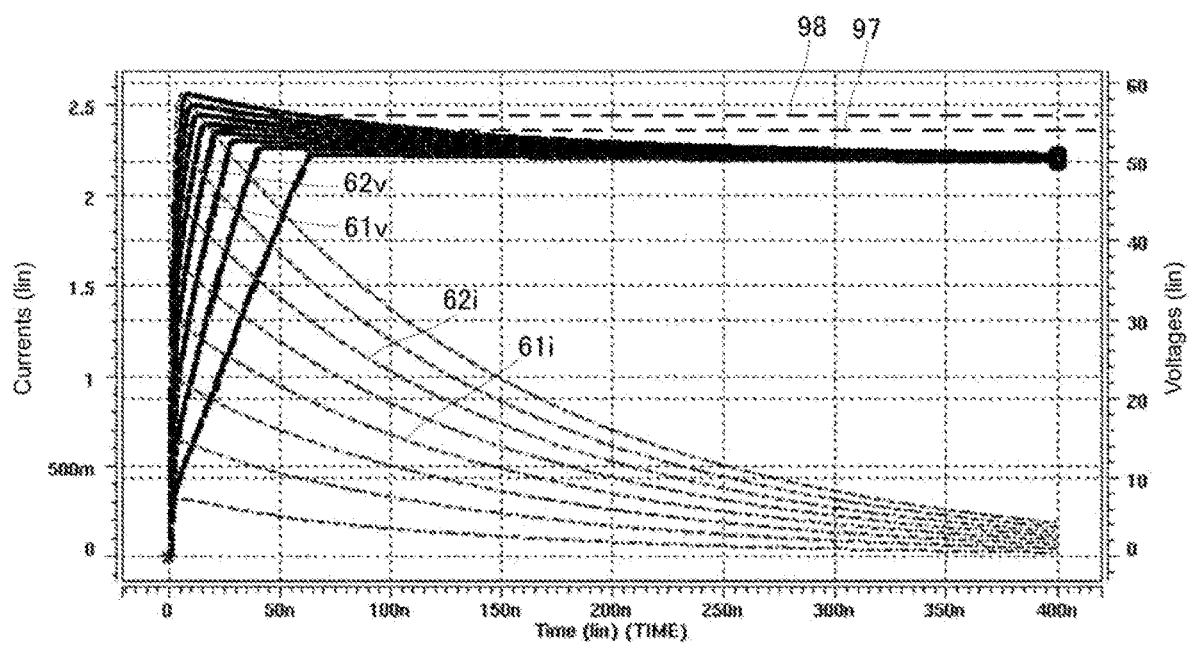
FIG. 3 is a graph chart showing a simulation result when setting the pull-down resistance of the ESD projection circuit to 2 kΩ.

FIG. 3 is a graph showing a result of a simulation by an HBM (Human Body Method) testing method.

As described above, according to the voltage-current characteristic shown in FIG. 2, since there is concern that the ESD breakdown voltage performance is insufficient when the pull-down resistance is low, there is also performed the verification using a simulation based on the HBM testing method.

Figure 17:
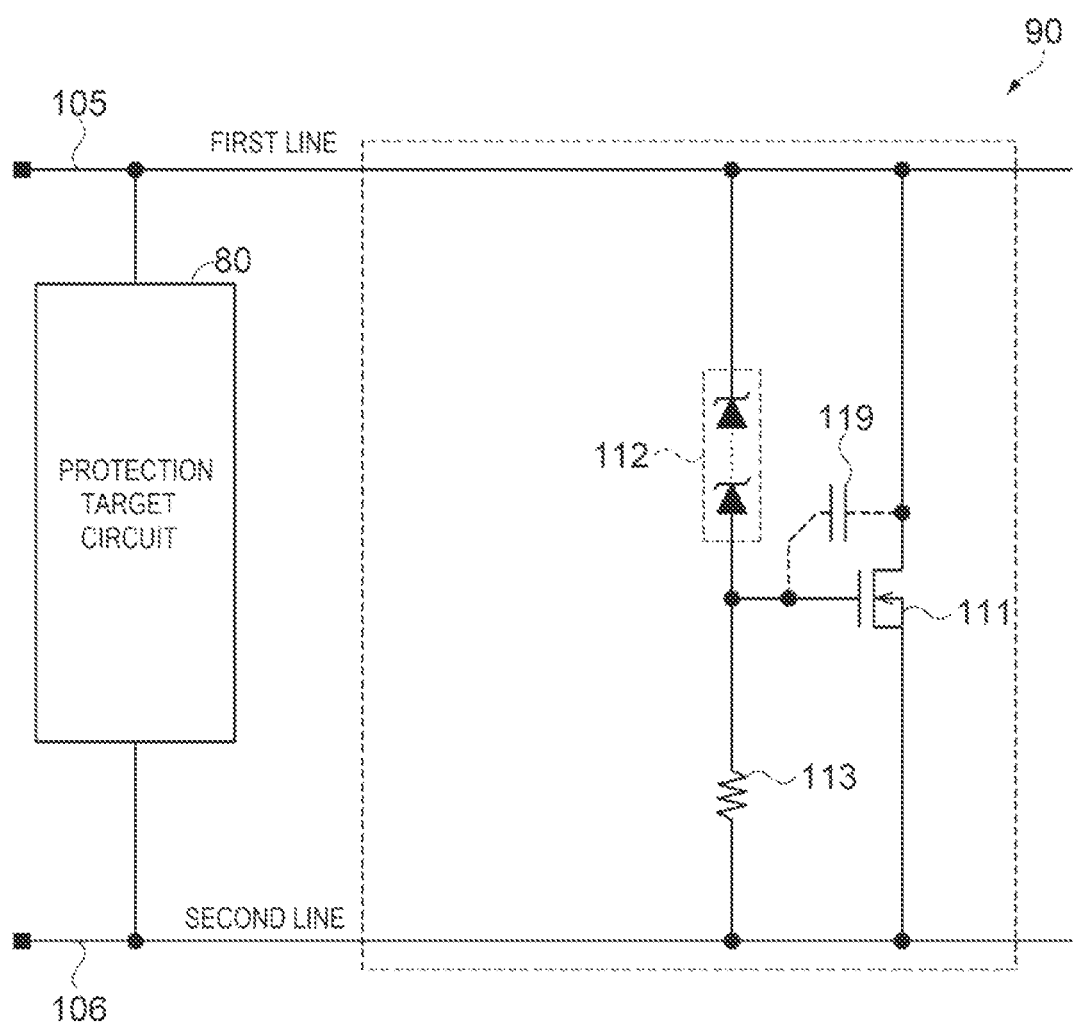
FIG. 17 is a circuit diagram of a related-art ESD projection circuit.

FIG. 3 shows a simulation result when setting the pull-down resistance of the ESD projection circuit 90 shown in FIG. 17 to 2 kΩ. It should be noted that as HBM applying conditions, an applied voltage varies from 500 V to 4,000 V by 500 V, a discharge capacitor is set to 100 pF, and an applied resistance is set to 1.5 kΩ.

The horizontal axis in FIG. 3 represents a time [nsec] axis, the left side vertical axis represents a drain current [A], and the right side vertical axis represents a drain voltage [V].

A graph 61i represents a variation of the drain current when applying 2,000 V, wherein a surge current fast and rapidly rises in about 10 nsec, and then decreases to a current value about a half of a peak current in about 110 nsec after reaching the peak current. Further, a graph 62i represents a variation of the surge current when applying 3,000 V, and shows substantially the same trend as in the graph 61i although the peak current is higher than when applying 2,000 V.

A graph 61v represents a variation of the drain voltage when applying 2,000 V, wherein a surge voltage fast and rapidly rises in about 10 nsec, and then gently decreases after reaching a peak voltage, but is kept in a voltage no lower than 50 V even when 400 nsec elapses. Further, a graph 62v represents a variation of the surge voltage when applying 3,000 V, and shows substantially the same trend as in the graph 61v although the peak voltage is several V higher than when applying 2,000 V.

A line segment 97 is a line representing the peak voltage of 54 V of the graph 61v when applying 2,000 V. As described above, since the breakdown voltage of the protection target circuit 80 is 55 V, it is possible to protect the protection target circuit 80 although an allowance is small.

A line segment 98 is a line representing the peak voltage of 56 V of the graph 62v when applying 3,000 V. Since the peak voltage of 56 V exceeds the breakdown voltage of 55 V of the protection target circuit 80, it is not achievable to protect the protection target circuit 80.

As described above, the shortage in the ESD breakdown voltage performance when the pull-down resistance is low is verified also from the result of the simulation by the HBM testing method shown in FIG. 3.

Figure 4:
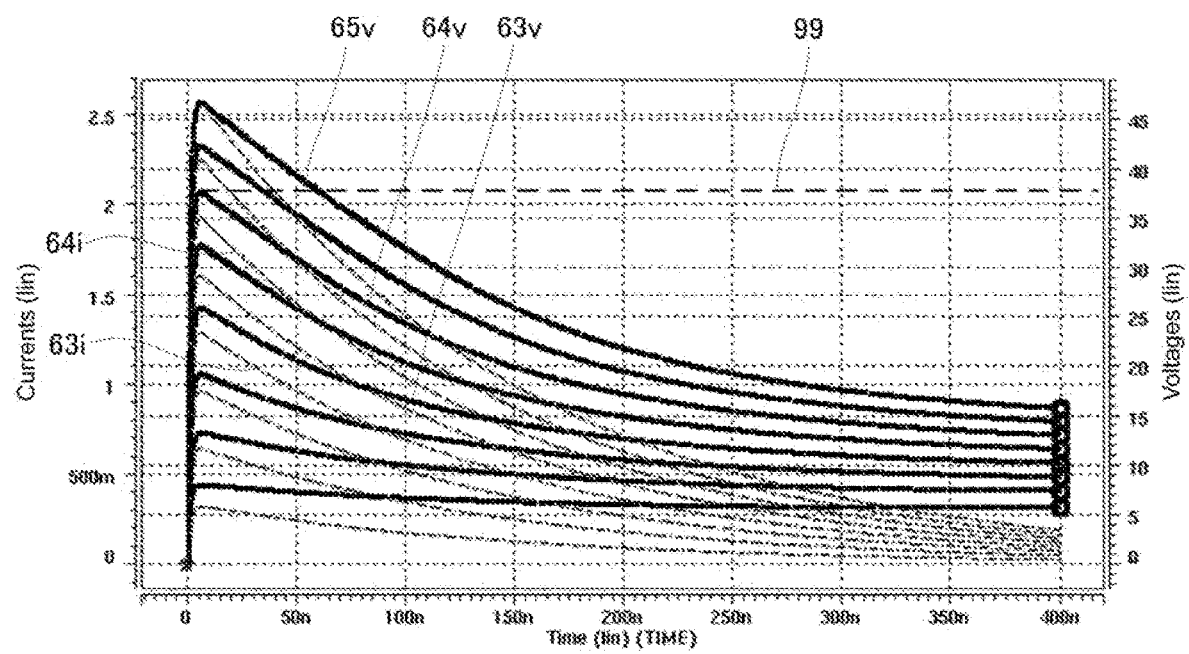
FIG. 4 is a graph chart showing a simulation result when setting the pull-down resistance of the ESD projection circuit to 100 kΩ.

FIG. 4 is a graph representing a simulation result when setting the pull-down resistance of the ESD protection circuit 90 shown in FIG. 17 to 100 kΩ, and corresponds to FIG. 3. It should be noted that the HBM applying conditions are the same as the conditions in FIG. 3.

A graph 63i represents a variation of the drain current when applying 2,000 V, wherein a surge current fast and rapidly rises in about 10 nsec, and then decreases to a current value about a half of a peak current in about 110 nsec after reaching the peak current. Further, a graph 64i represents a variation of the surge current when applying 3,000 V, and shows substantially the same trend as in the graph 63i although the peak current is higher than when applying 2,000 V.

A graph 63v represents a variation of the drain voltage when applying 2,000 V, wherein a surge voltage fast and rapidly rises in about 10 nsec, and then decreases to a voltage value about a half of a peak voltage in about 170 nsec after reaching the peak voltage. Further, a graph 64v represents a variation of the surge voltage when applying 3,000 V, and shows substantially the same trend as in the graph 63v although the peak voltage is about 10 V higher than when applying 2,000 V.

A line segment 99 is a line representing the peak voltage of 38 V of the graph 64v when applying 3,000 V. As described above, since the breakdown voltage of the protection target circuit 80 is 55 V, it is possible to protect the projection target circuit 80 with a significant allowance. Further, the peak voltage of the graph 65v when applying 4,000 V is about 47 V, and it is understood that there is the ESD breakdown voltage performance no lower than 4,000 V.

As described above, the high ESD breakdown voltage performance when the pull-down resistance is high is verified also from the result of the simulation by the HBM testing method shown in FIG. 4.

As described above, it is understood that in the ESD protection circuit 90 of the related art in which the pull-down resistance is formed of the resistor 113 as a single fixed resistance, it is difficult to achieve both of the noise tolerance during the operation of the protection target circuit 80, and the breakdown voltage performance with respect to the ESD voltage.

Going back to FIG. 1, in contrast, according to the ESD protection circuit 200 in the present embodiment, by switching the transistor 14 in accordance with operation/non-operation of the protection target circuit 80, it is possible to switch the pull-down resistance value of the power transistor 11. The description will hereinafter be presented assuming that the resistor 13 has a resistance value of 100 kΩ, the resistor 17 has a resistance value of 1 kΩ, an ON resistance of the transistor 14 is 1 kΩ, the resistor 15 has a resistance value of 200 kΩ, and the capacitor 16 has a capacitance value of 1 pF as a preferred example. It should be noted that these numerical values are not a limitation.

Figure 5:
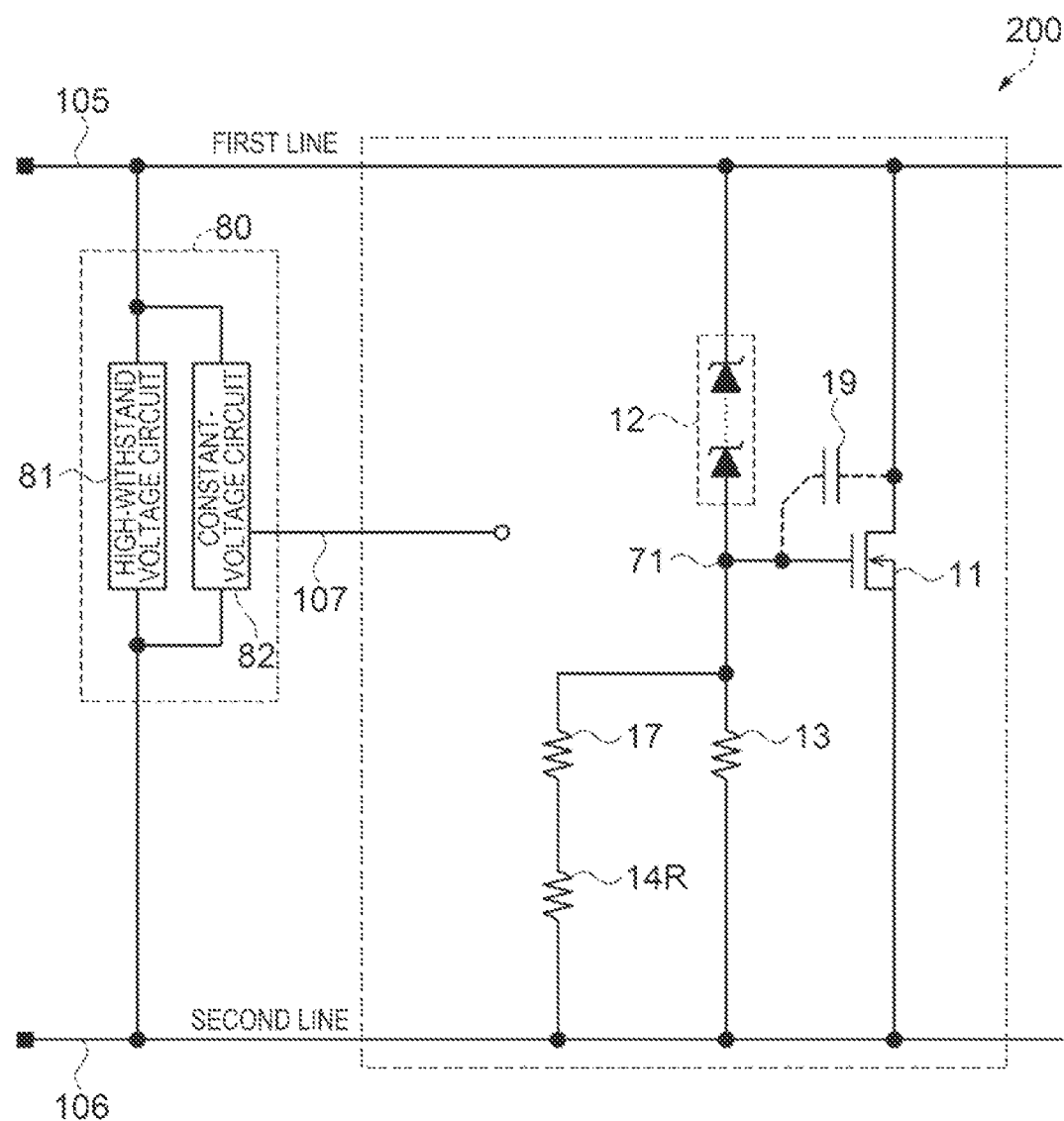
FIG. 5 is an equivalent circuit diagram during operation of a protection target circuit.

FIG. 5 is an equivalent circuit diagram during the operation of the protection target circuit.

First, during the operation of the protection target circuit 80, 5 V is supplied as the third potential from the constant-voltage circuit 82 to the third line 107. Thus, the gate potential of the transistor 14 becomes at 5 V via the resistor 15 as the pull-up resistance to be coupled to the third line 107, and thus, the transistor 14 becomes in an ON state. FIG. 5 is an equivalent circuit diagram of the ESD protection circuit 200 in this state, wherein the pull-down resistance of the power transistor 11 is obtained as a combined resistance of the resistor 13, the resistor 17, and the ON resistance 14R of the transistor 14. Particularly, 100 kΩ*(1 kΩ+1 kΩ)/(100 kΩ+(1 kΩ+1 kΩ))≈1.96 kΩ is obtained.

Going back to FIG. 1, then, during non-operation of the protection target circuit 80, no potential is supplied to the third line 107. Since the potential at both ends of the capacitor 16 is also 0 V, the pull-down resistance of the power transistor 11 is formed only of the resistor 13, and becomes 100 kΩ.

Method of Determining Circuit Constant

The circuit constant of the ESD protection circuit 200 according to the present embodiment is determined in the following manner.

First, in order to achieve both of the noise tolerance during the operation of the protection target circuit 80 and the breakdown voltage performance with respect to the ESD voltage, it is sufficient to make the value of the pull-down resistance different between operation/non-operation of the protection target circuit 80. Particularly, in FIG. 2, the pull-down resistance is set to 2 kΩ as in the graph 91 robust over the noise during the operation of the protection target circuit 80, and during non-operation thereof, the pull-down resistance is set to 100 kΩ at which the breakdown voltage performance is high.

In order to fulfill the above, the resistor 13 is set to 100 kΩ, the resistor 17 is set to 1 kΩ, and the ON resistance of the transistor 14 is set to 1 kΩ. It should be noted that this is not a limitation, and it is sufficient to set the values within a range in which both of the noise tolerance and securement of the breakdown voltage performance can be achieved, and for example, it is sufficient for the resistor 13 to have a resistance value higher than the sum of the resistance value of the resistor 17 and the ON resistance value of the transistor 14. Further, it is sufficient for the ON resistance value of the transistor 14 to be no lower than 500Ω, and no higher than 2 kΩ.

Further, as described with reference to FIG. 3, the constant of the resistor 15 and the capacitor 16 is determined considering the fact that the surge current fast and rapidly rises in about 10 nsec, and then, decreases to a current value about a half of the peak current about 110 nsec later. Particularly, it is sufficient to set the time constant due to the resistor 15 and the capacitor 16 so as to be less than 150 nsec.

In a preferred example, the time constant is set to 200 nsec, and thus, it is determined that the resistance value of the resistor 15 is 200 kΩ, and the capacitance value of the capacitor 16 is 1 pF.

As described hereinabove, according to the ESD protection circuit 200 related to the present embodiment, the following advantages can be obtained.

The ESD protection circuit 200 is an ESD protection circuit which is disposed between the first line 105 for supplying the first potential and the second line 106 for supplying the second potential different from the first potential, and protects the protection target circuit 80 from the surge voltage, and is provided with the power transistor 11 disposed between the first line 105 and the second line 106, the clamp circuit 12 disposed between the first line 105 and the first node 71 to which the gate of the power transistor 11 is coupled, the resistor 13 as the first resistor disposed between the first node 71 and the second line 106, the transistor 14 disposed between the first node 71 and the second line 106, the third line 107 supplied with the third potential generated by the constant-voltage circuit 82 of the protection target circuit 80, and the resistor 15 as the second resistor and the capacitor 16 as the first capacitor coupled in series between the second node 72 coupled to the third line 107 and the second line 106, wherein when defining the junction between the resistor 15 and the capacitor 16 as the third node 73, the gate of the transistor 14 is coupled to the third node 73, and the third potential is a potential between the first potential and the second potential.

According to this circuit, since the transistor 14 turns ON due to the constant potential of the third line 107 during the operation of the protection target circuit 80, the pull-down resistance of the power transistor 11 becomes the combined resistance of the resistor 13, the resistor 17, and the ON resistance of the transistor 14, and becomes as low as about 2 kΩ. In contrast, during non-operation of the protection target circuit 80, since the transistor 14 turns OFF, the pull-down resistance is formed only of the resistor 13, and becomes as high as 100 kΩ.

In other words, unlike the related art circuit in which the pull-down resistance has a fixed resistance value, according to this ESD protection circuit 200, by switching the transistor 14 in accordance with operation/non-operation of the protection target circuit 80, it is possible to switch the value of the pull-down resistance.

Therefore, during operation, it is possible to lower the pull-down resistance to make the state in which it is difficult to react the noise from the power supply. Further, during non-operation, it is possible to raise the pull-down resistance to ensure the necessary ESD breakdown voltage performance taking the breakdown voltage of the protection target circuit 80 and the required withstand voltage for the ESD even when the potential difference between the maximum operating voltage and the breakdown voltage of the protection target circuit 80 is small.

Therefore, it is possible to provide the ESD protection circuit 200 capable of achieving both of the noise tolerance during the operation of the protection target circuit and the breakdown voltage performance with respect to the ESD voltage.

Further, the ON resistance value of the transistor 14 is no lower than 500Ω and no higher than 2 kΩ, and is set to 1 kΩ in the preferred example. According to the above, it is possible to achieve both of the noise tolerance and the securement of the breakdown voltage performance.

Further, there is further included the resistor 17 as the third resistor disposed between the first node 71 and the drain of the transistor 14.

According to the above, since an adjustment width of the resistance value of the pull-down resistance of the power transistor 11 during the operation of the protection target circuit 80 increases, it is possible to perform optimum constant establishment which achieves both of the noise tolerance and the securement of the breakdown voltage performance.

Embodiment 2

Different Aspect of ESD Protection Circuit—1

Figure 6:
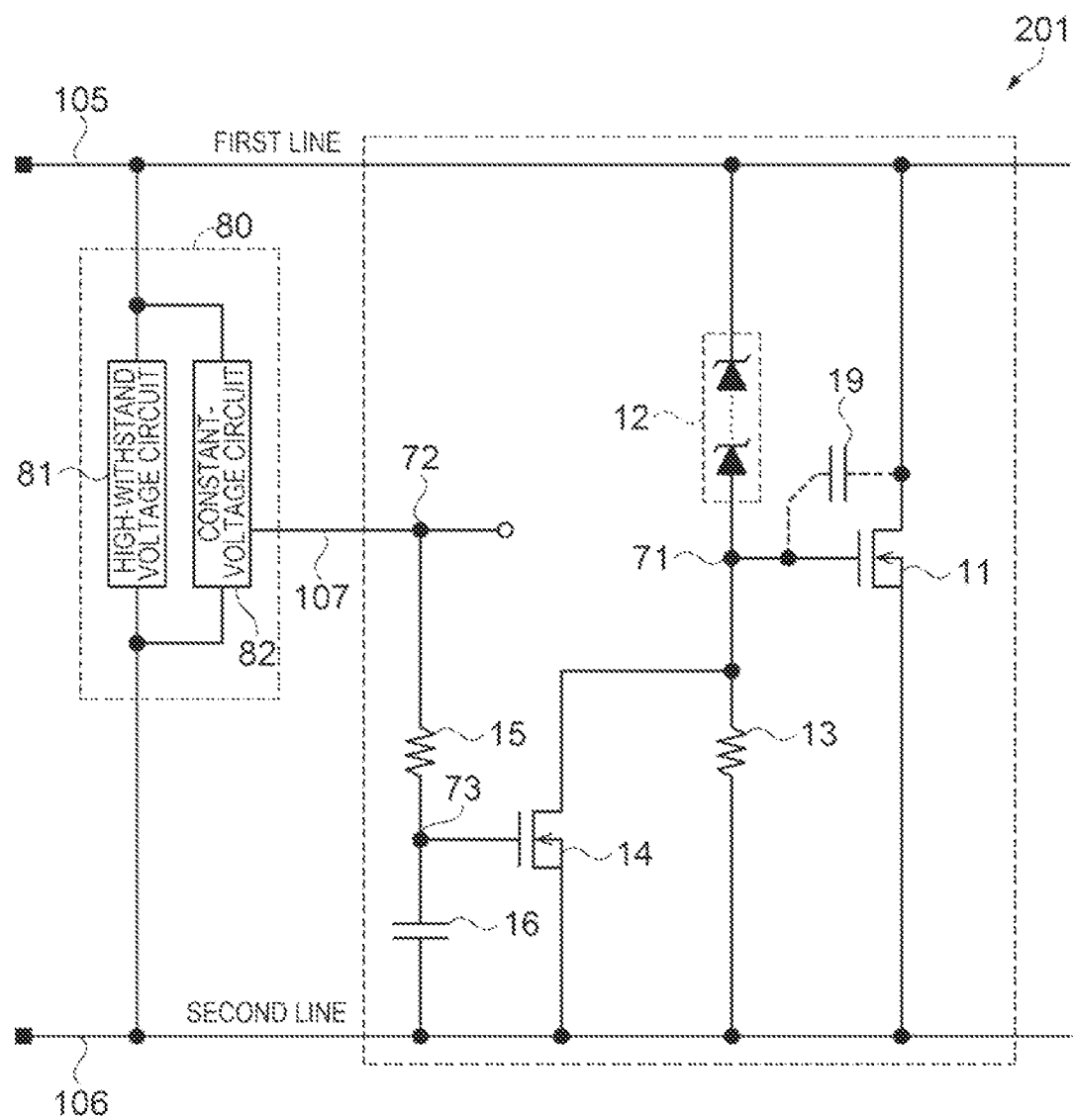
FIG. 6 is a circuit diagram of an ESD protection circuit according to Embodiment 2.
Figure 7:
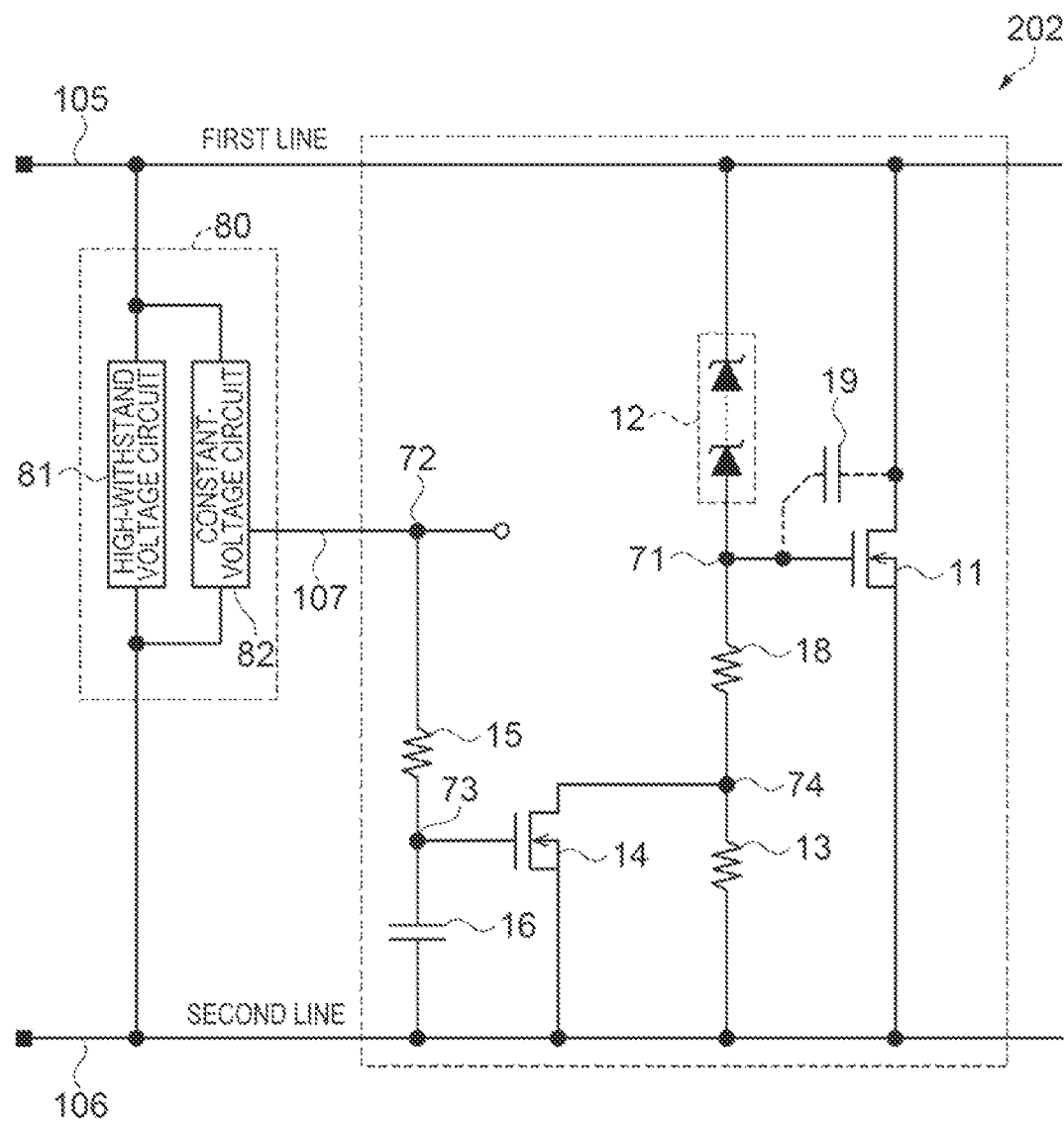
FIG. 7 is a circuit diagram of an ESD protection circuit in a different aspect.
Figure 8:
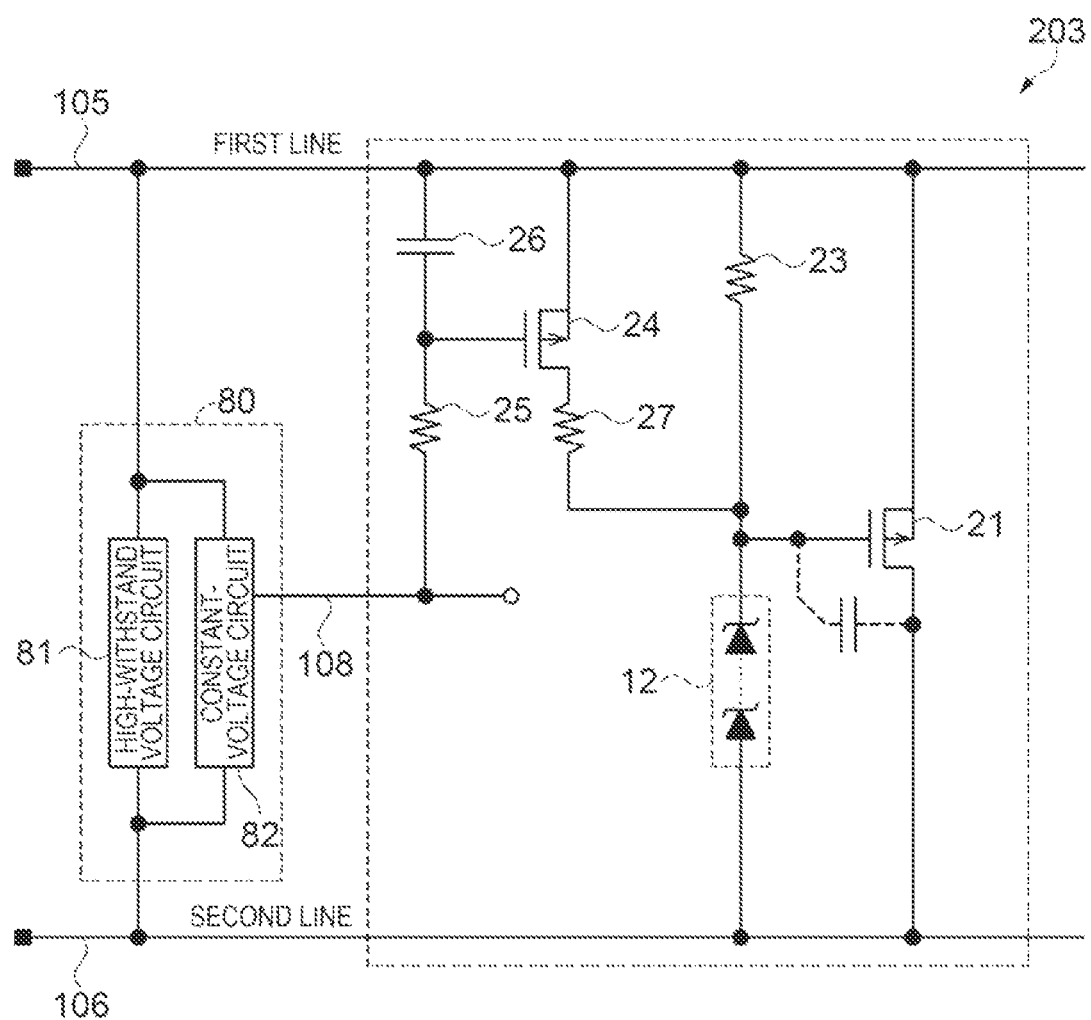
FIG. 8 is a circuit diagram of an ESD protection circuit in a different aspect.

FIG. 6, FIG. 7, and FIG. 8 are each a circuit diagram of the ESD protection circuit according to the present embodiment, and each correspond to FIG. 1. The ESD protection circuit is not limited to the circuit configuration shown in FIG. 1, but can arbitrarily be modified in accordance with the required specifications. Hereinafter, the same constituent portions as in Embodiment 1 are denoted by the same reference numerals, and redundant descriptions will be omitted.

In the ESD protection circuit 201 shown in FIG. 6, the resistor 17 coupled to the drain of the transistor 14 is omitted. The other circuit configuration is the same as in FIG. 1. In the case of this configuration, by setting the ON resistance of the transistor 14 to 2 kΩ, it is possible to set the combined resistance value with the resistor 13 to about 2 kΩ. Further, since a parasitic diode exists between the source and the drain of the transistor 14, and the parasitic diode plays substantially the same role as the zener diode in Document 1, it is possible to prevent the excessive rise in gate voltage of the power transistor 11.

In an ESD protection circuit 202 shown in FIG. 7, the resistor 17 coupled to the drain of the transistor 14 is omitted. Further, a resistor 18 as a fourth resistor is disposed between the first node 71 and the resistor 13. Further, when defining a node between the resistor 13 and the resistor 18 as a fourth node 74, the drain of the transistor is coupled to the fourth node 74. The other circuit configuration is the same as in FIG. 1. In the case of this configuration, the resistor 13 is set to 99 kΩ, the resistor 18 is set to 1 kΩ, and the ON resistance of the transistor 14 is set to 1 kΩ. Thus, the pull-down resistance of the power transistor 11 during the operation of the protection target circuit 80 can be set to about 2 kΩ.

In the ESD protection circuit 203 shown in FIG. 8, there are used a power transistor 21 as a P-channel power MOS transistor, and a transistor 24 as a P-channel MOS transistor. Further, the constant-voltage circuit 82 of the protection target circuit 80 is provided with a fourth line 108 for supplying a potential, which is 5 V lower than the first potential supplied to the first line 105, as the third potential. In accordance with the above, each of the elements has an arrangement reversed in polarity from the circuit shown in FIG. 1. It should be noted that in comparison to FIG. 1, a resistor 23 corresponds to the resistor 13, a resistor 25 corresponds to the resistor 15, a resistor 27 corresponds to the resistor 17, and a capacitor 26 corresponds to the capacitor 16. Even when the polarity is reversed, the ESD protection circuit 203 functions similarly to the ESD protection circuit 200 shown in FIG. 1.

It should be noted that the expression "reversed in polarity from the circuit shown in FIG. 1" described above means that the third potential is a potential 5 V higher than the second potential in the circuit shown in FIG. 1, and the third potential is a potential 5 V lower than the first potential in the circuit shown in FIG. 8.

As described hereinabove, according to the ESD protection circuit 201, the ESD protection circuit 202, and the ESD protection circuit 203 related to the present embodiment, the following advantages can be obtained in addition to the advantages in Embodiment 1.

According to the ESD protection circuit 201, since the resistor 17 is omitted, it is possible to reduce the size of the circuit. Further, due to the parasitic diode between the source and the drain of the transistor 14, it is possible to prevent the excessive rise in gate voltage of the power transistor 11.

Similarly, since the resistor 17 is omitted, the ESD protection circuit 202 can also be reduced in size of the circuit. Further, according to the ESD protection circuit 203, even in the configuration using the P-channel power MOS transistor, it is possible to obtain substantially the same functions and advantages as those of the ESD protection circuit 200 shown in FIG. 1.

Embodiment 3

Different Aspect of ESD Protection Circuit—2

Figure 9:
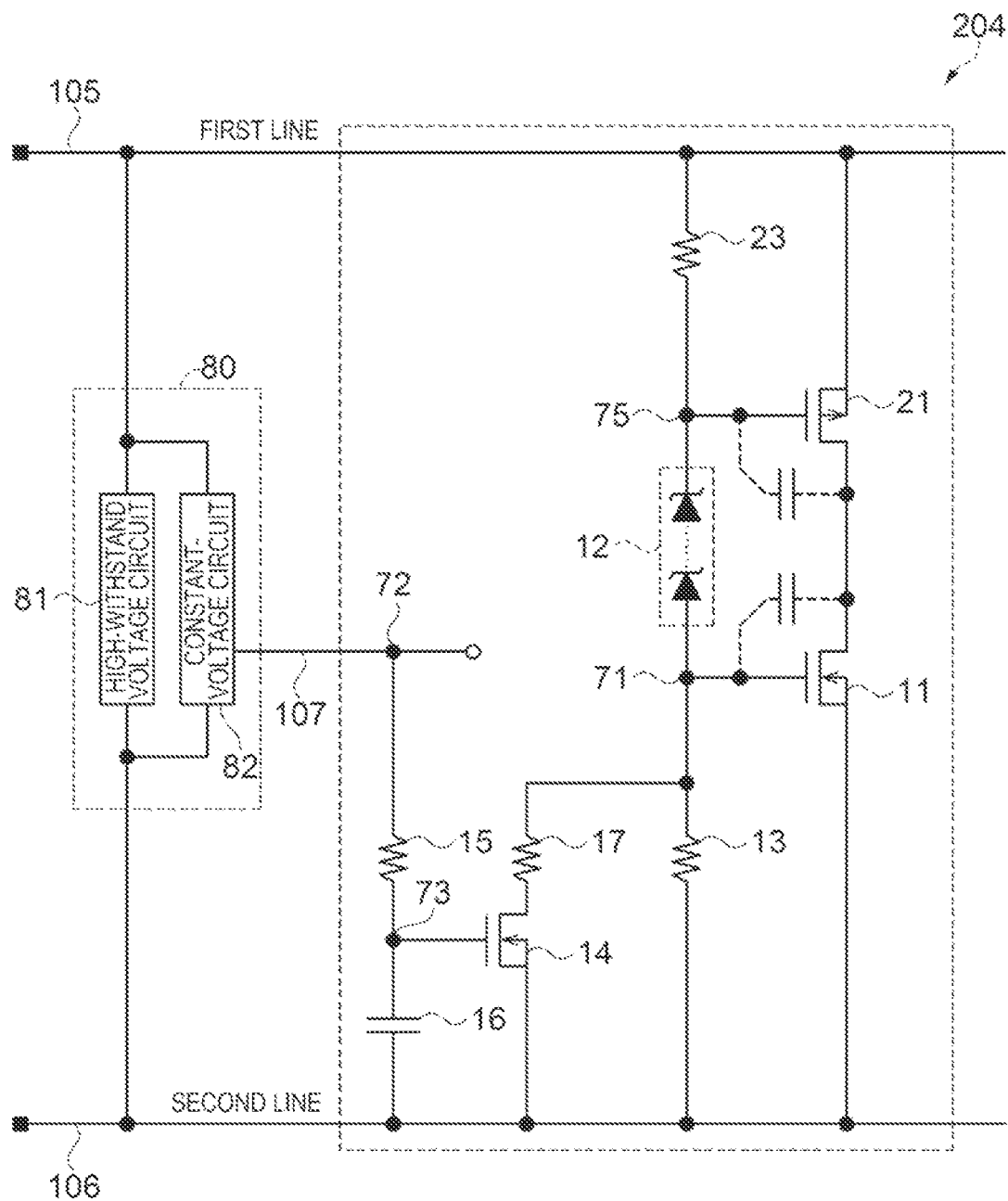
FIG. 9 is a circuit diagram of an ESD protection circuit according to Embodiment 3.
Figure 10:
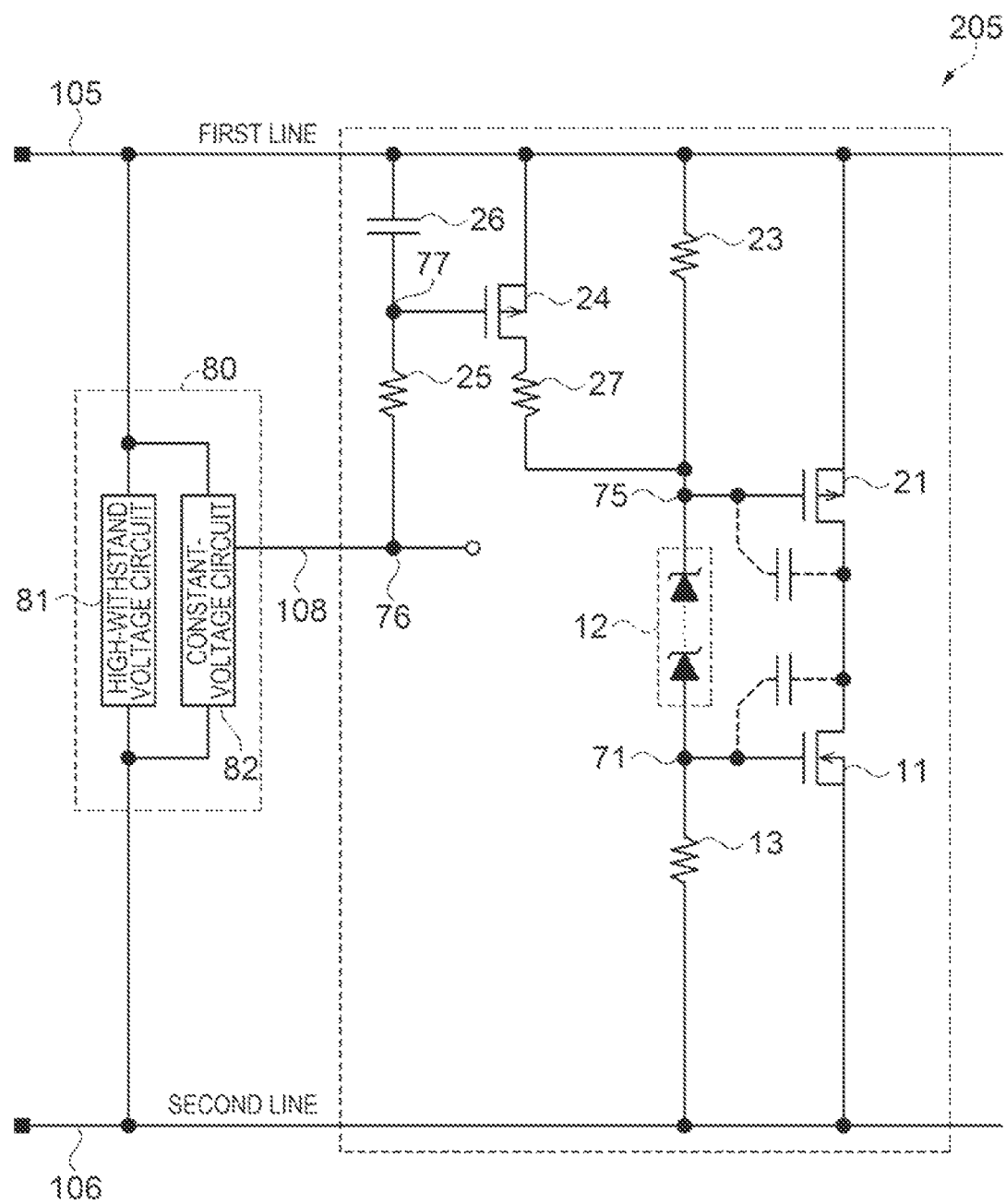
FIG. 10 is a circuit diagram of an ESD protection circuit in a different aspect.
Figure 11:
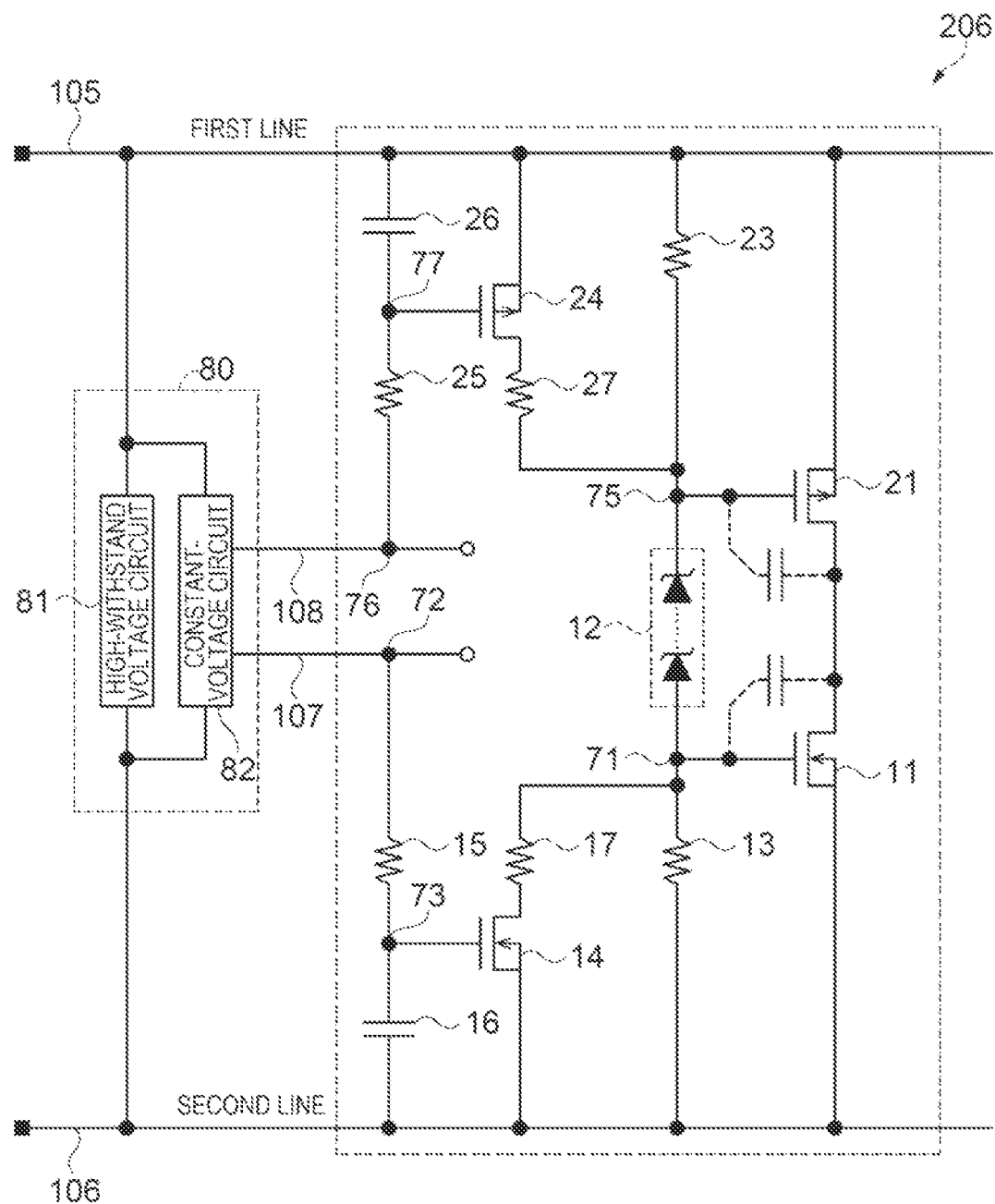
FIG. 11 is a circuit diagram of an ESD protection circuit in a different aspect.

FIG. 9, FIG. 10, and FIG. 11 are each a circuit diagram of the ESD protection circuit according to the present embodiment, and each correspond to FIG. 1. The ESD protection circuit is not limited to the circuit configuration shown in FIG. 1, but can arbitrarily be modified in accordance with the required specifications. Hereinafter, the same constituent portions as in the embodiments described above are denoted by the same reference numerals, and redundant descriptions will be omitted.

In the ESD protection circuit 204 shown in FIG. 9, the resistor 23 as a fifth resistor is disposed between the first line 105 and the clamp circuit 12. Between the first line 105 and the power transistor 11, there is disposed the power transistor 21 as a second power MOS transistor different in polarity from the power transistor 11. Further, when defining a node between the clamp circuit 12 and the resistor 23 as a fifth node 75, the gate of the power transistor 21 is coupled to the fifth node 75. The other circuit configuration is the same as in FIG. 1. The power transistor 21 is a P-channel power MOS transistor.

According to this configuration, since the breakdown voltage of the ESD protection circuit 204 becomes a sum of the breakdown voltage of the power transistor 11 and the breakdown voltage of the power transistor 21, it is possible to reduce a breakdown risk of the power transistor 11 and the power transistor 21 as discharge elements. Further, in the case of this configuration, it is possible to use a medium-withstand voltage MOS transistor as either of the power transistor 11 and the power transistor 21.

The ESD protection circuit 205 shown in FIG. 10 has a configuration obtained by adding an N-channel second power MOS transistor different in polarity similarly to FIG. 9 in the configuration using the P-channel power MOS transistor shown in FIG. 8.

Particularly, between the second line 106 and the power transistor 21, there is disposed the power transistor 11 as a second power MOS transistor different in polarity from the power transistor 21. Between the second line 106 and the clamp circuit 12, there is disposed the resistor 13 as a fifth resistor. Further, the gate of the power transistor 11 is coupled to the first node 71. The other circuit configuration is the same as in FIG. 8. The power transistor 11 is an N-channel power MOS transistor.

According to this configuration, since the breakdown voltage of the ESD protection circuit 205 becomes a sum of the breakdown voltage of the power transistor 21 and the breakdown voltage of the power transistor 11, it is possible to reduce a breakdown risk of the power transistor 21 and the power transistor 11 as the discharge elements. Further, in the case of this configuration, it is possible to use a medium-withstand voltage MOS transistor as either of the power transistor 21 and the power transistor 11.

The ESD protection circuit 206 shown in FIG. 11 is a circuit obtained by merging the ESD protection circuit 200 shown in FIG. 1 and the ESD protection circuit 203 shown in FIG. 8 with each other using the clamp circuit 12 in common. In other words, the ESD protection circuit 206 is a circuit obtained by adding the fourth line 108 for supplying the potential, which is 5 V lower than the first potential supplied to the first line 105, as the fourth potential, and an accompanying pull-down resistance switching circuit to the configuration of the ESD protection circuit 204 shown in FIG. 9.

Particularly, when defining the node between the clamp circuit 12 and the resistor 23 as the fifth node 75, the ESD protection circuit 206 has the transistor 24 as a second MOS transistor disposed between the fifth node 75 and the first line 105, the resistor 27 as a sixth resistor disposed between the fifth node 75 and the transistor 24, and the fourth line 108 supplied with the fourth potential as a potential different from the third potential. Further, the resistor 25 as a seventh resistor and the capacitor 26 as a second capacitor coupled in series to one another between a sixth node 76 coupled to the fourth line 108 and the first line 105 are further provided. When defining a junction between the resistor 25 and the capacitor 26 as a seventh node 77, the gate of the transistor 24 is coupled to the seventh node 77, and the fourth potential is set to a potential between the first potential and the second potential.

According to this configuration, since the breakdown voltage of the ESD protection circuit 206 becomes a sum of the breakdown voltage of the power transistor 21 and the breakdown voltage of the power transistor 11, it is possible to reduce a breakdown risk of the power transistor 21 and the power transistor 11 as the discharge elements. Further, during the operation of the protection target circuit 80, it is possible to enhance the noise tolerance in the power transistor 21 at the P-channel side in addition to the power transistor at the N-channel side.

As described hereinabove, according to the ESD protection circuit 204, the ESD protection circuit 205, and the ESD protection circuit 206 related to the present embodiment, the following advantages can be obtained in addition to the advantages in Embodiment 1.

According to the ESD protection circuit 204 and the ESD protection circuit 205, since the breakdown voltage of the protection circuit becomes a sum of the breakdown voltage of the power transistor 11 and the breakdown voltage of the power transistor 21, it is possible to reduce the breakdown risk of the power transistor 11 and the power transistor 21 as the discharge elements. Further, by using a medium-withstand voltage MOS transistor as either of the power transistor 11 and the power transistor 21, it is possible to reduce the circuit size.

When defining a node between the clamp circuit 12 and the resistor 23 as the fifth node 75, the ESD protection circuit 206 has the transistor 24 as the second MOS transistor disposed between the fifth node 75 and the first line 105, the resistor 27 as the sixth resistor disposed between the fifth node 75 and the transistor 24, and the fourth line 108 supplied with the fourth potential as a potential different from the third potential, and is further provided with the resistor 25 as the seventh resistor and the capacitor 26 as the second capacitor coupled in series to one another between the sixth node 76 coupled to the fourth line 108 and the first line 105, and when defining the junction between the resistor 25 and the capacitor 26 as the seventh node 77, the gate of the transistor 24 is coupled to the seventh node 77, and the fourth potential is a potential between the first potential and the second potential.

According to this configuration, since the breakdown voltage of the ESD protection circuit 206 becomes a sum of the breakdown voltage of the power transistor 21 and the breakdown voltage of the power transistor 11, it is possible to reduce a breakdown risk of the power transistor 21 and the power transistor 11 as the discharge elements.

Further, since both of the power transistor 11 at the N-channel side and the power transistor 21 at the P-channel side are provided with the respective pull-down resistance switching circuits, the pull-down resistance can be made low during the operation of the protection target circuit 80, and therefore, it is possible to enhance the noise tolerance.

Embodiment 4

Different Aspect of ESD Protection Circuit—3

Figure 12:
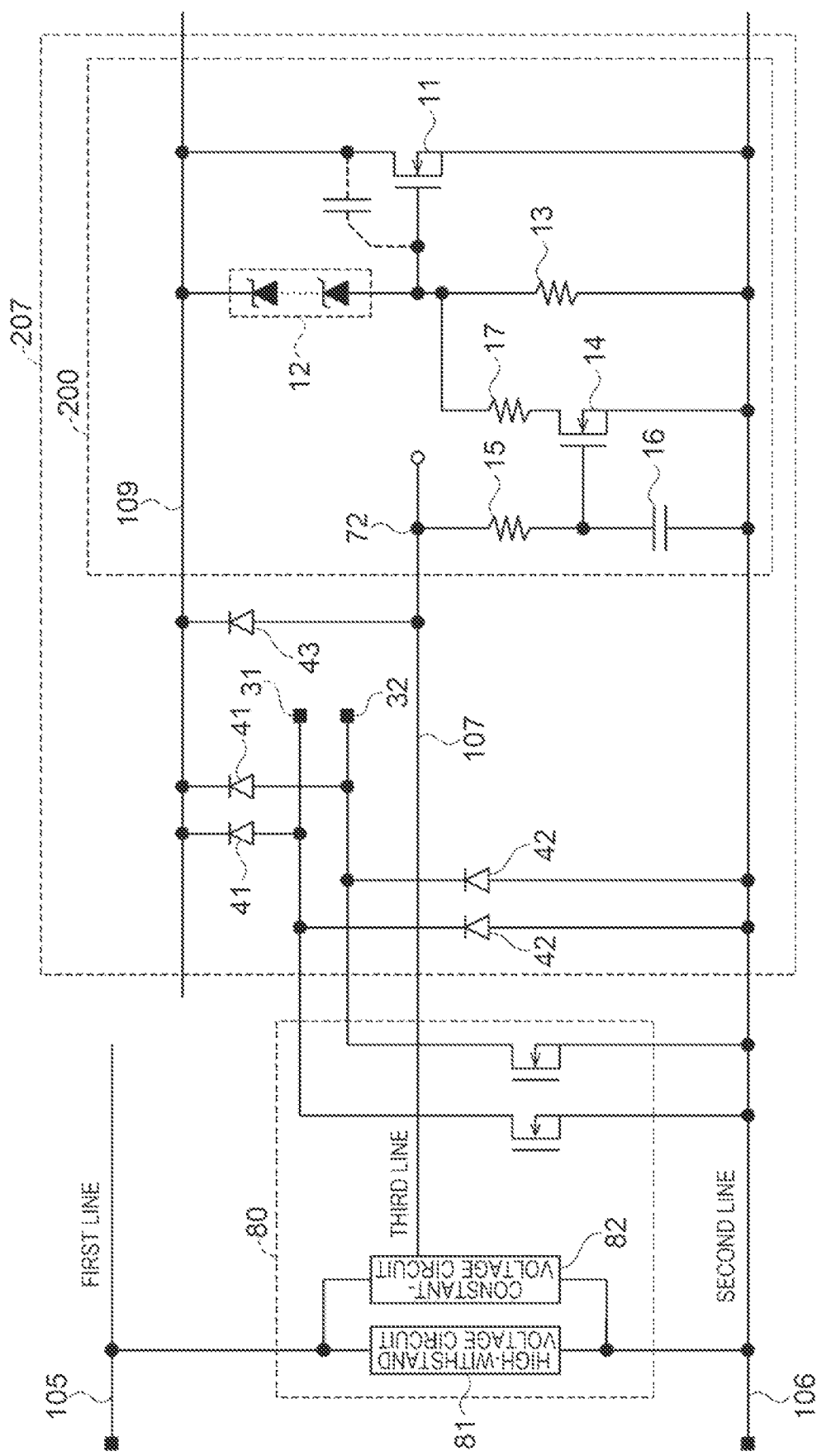
FIG. 12 is a circuit diagram of an ESD protection circuit according to Embodiment 4.
Figure 13:
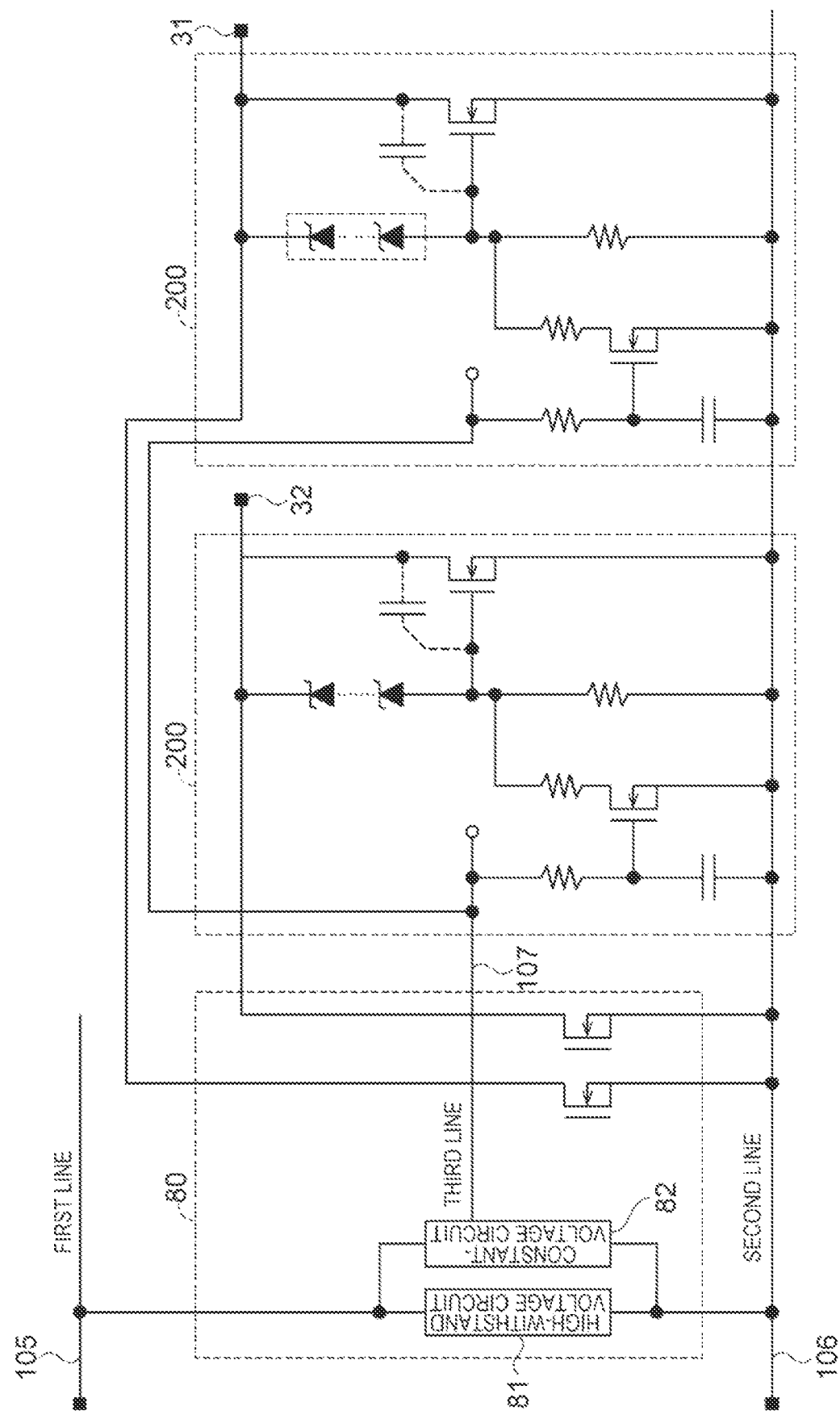
FIG. 13 is a circuit diagram of an ESD projection circuit in a comparative example.

FIG. 12 is a circuit diagram of an ESD protection circuit according to the present embodiment, and corresponds to FIG. 1. FIG. 13 is a circuit diagram of an ESD protection circuit according to a comparative example, and corresponds to FIG. 12.

The ESD protection circuit described above can also be applied to an open drain terminal provided to the protection target circuit. Hereinafter, the same constituent portions as in the embodiments described above are denoted by the same reference numerals, and redundant descriptions will be omitted.

FIG. 13 is a diagram showing an example of the case of applying the ESD protection circuit 200 shown in FIG. 1 to the open drain terminal. The protection target circuit 80 is provided with an OD terminal 31 and an OD terminal 32 as N-channel open drain terminals. When applying the ESD protection circuit 200 shown in FIG. 1 to the open drain terminals, normally, a high-potential line of the ESD protection circuit 200 is coupled to the OD terminal 31 as shown in FIG. 13. In the case of this configuration, the corresponding number of the ESD protection circuits 200 to the number of the open drain terminals become necessary. For example, in the case shown in FIG. 13, the two ESD protection circuits 200 become necessary.

In contrast, in the ESD protection circuit 207 according to the present embodiment shown in FIG. 12, by using a common electrode line, it is made possible to protect a plurality of open drain terminals with a single ESD protection circuit 200 even when the protection target circuit 80 is provided with the plurality of open drain terminals. First, the protection target circuit 80 is provided with the OD terminal 31 and the OD terminal 32 as two open drain terminals.

A fifth line 109 is a common electrode line for supplying the fifth potential as a potential higher than the second potential of the second line 106. A high-potential line of the ESD protection circuit 200 is coupled to the fifth line 109. Further, a first diode 41 is disposed in a forward direction between the OD terminal 31 and the fifth line 109. A second diode 42 is disposed in a forward direction between the second line 106 and the OD terminal 31. It should be noted that the first diode 41 and the second diode 42 are disposed for each of the open drain terminal as a pair of diodes. Therefore, also in the OD terminal 32, the first diode 41 and the second diode 42 are coupled in a similar manner.

Further, a third diode 43 is disposed in a forward direction between the third line 107 and the fifth line 109.

It should be noted that the "forward direction" described above means a configuration in which the anode and the cathode of the first diode 41 are respectively coupled to the N-channel open drain terminal and the fifth line 109, the anode and the cathode of the second diode 42 are respectively coupled to the second line 106 and the N-channel open drain terminal, and the anode and the cathode of the third diode 43 are respectively coupled to the third line 107 and the fifth line 109.

Figure 14:
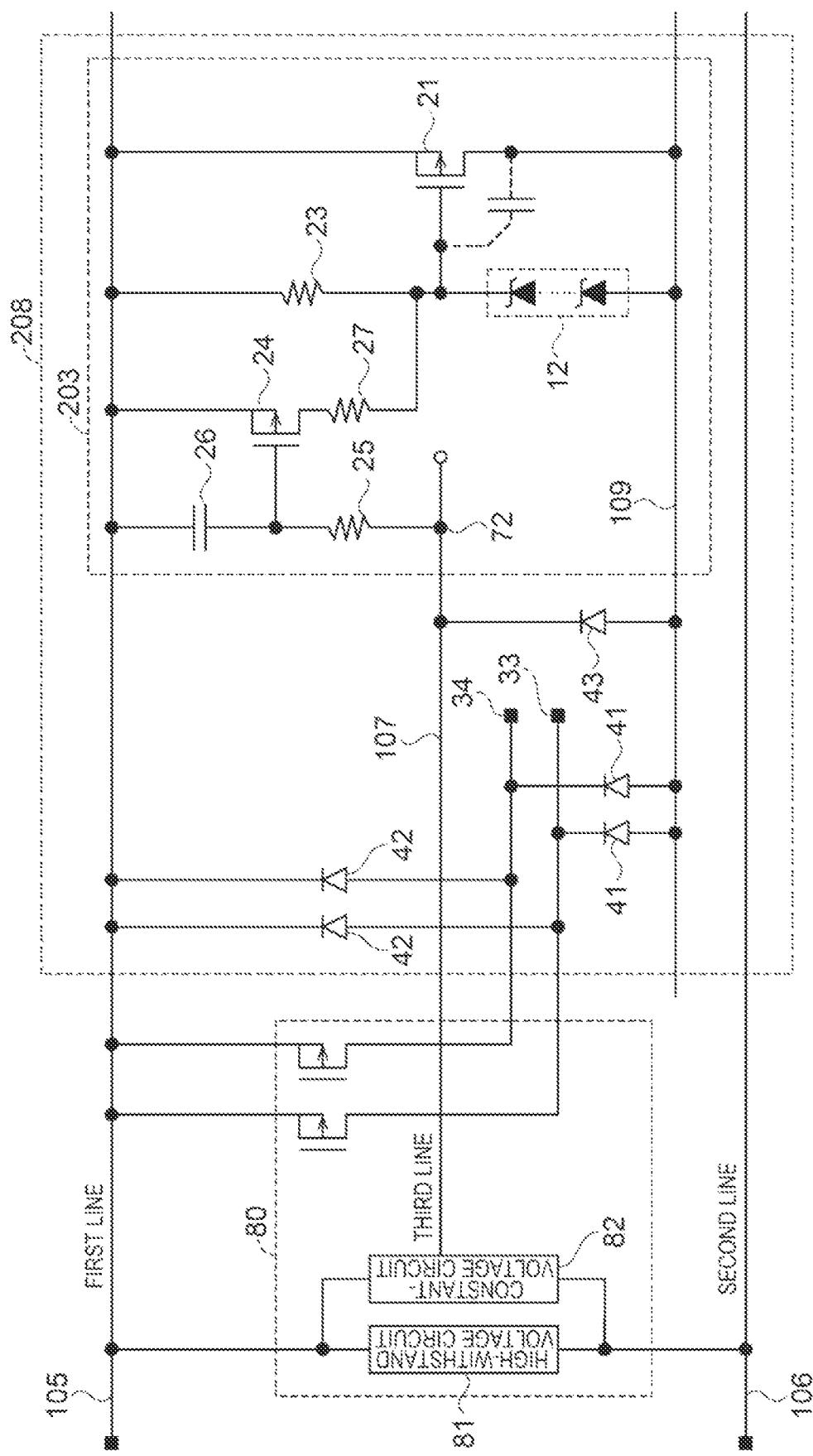
FIG. 14 is a circuit diagram of an ESD protection circuit in a different aspect.

FIG. 14 is a circuit diagram of an ESD protection circuit according to the present embodiment, and corresponds to FIG. 2 and FIG. 12. The ESD protection circuit 208 shown in FIG. 14 copes with a P-channel open drain terminal provided to the protection target circuit, which is different from the circuit shown in FIG. 12.

The protection target circuit 80 shown in FIG. 14 is provided with an OD terminal 33 and an OD terminal 34 as the P-channel open drain terminals. For the P-channel open drain terminals, there is used the ESD protection circuit 203 provided with the P-channel power transistor 21 shown in FIG. 8. Particularly, similarly to FIG. 12, by using the fifth line 109 as the common electrode line, it is made possible to protect a plurality of open drain terminals with a single ESD protection circuit 203 even when the protection target circuit is provided with the plurality of P-channel open drain terminals.

The fifth line 109 is the common electrode line for supplying the fifth potential as a potential lower than the first potential of the first line 105. A low-potential line of the ESD protection circuit 203 is coupled to the fifth line 109. Further, the first diode 41 is disposed in a forward direction between the fifth line 109 and the OD terminal 33. The second diode 42 is disposed in a forward direction between the OD terminal 33 and the first line 105. It should be noted that the first diode 41 and the second diode 42 are disposed for each of the open drain terminal as a pair of diodes. Therefore, also in the OD terminal 34, the first diode 41 and the second diode 42 are coupled in a similar manner. Further, the third diode 43 is disposed in a forward direction between the fifth line 109 and the third line 107. It should be noted that the "forward direction" described above means that the anode and the cathode of the first diode 41 are respectively coupled to the fifth line 109 and the OD terminal 33, the anode and the cathode of the second diode 42 are respectively coupled to the OD terminal 33 and the first line 105, and the anode and the cathode of the third diode 43 are respectively coupled to the fifth line 109 and the third line 107.

As described hereinabove, according to the ESD protection circuit 207 related to the present embodiment, the following advantages can be obtained in addition to the advantages in Embodiment 1.

The ESD protection circuit 207 is provided with the ESD protection circuit 200, the first diode 41 is disposed in the forward direction between the OD terminal 31 and the fifth line 109 for supplying the fifth potential as a potential higher than the second potential, the second diode 42 is disposed in the forward direction between the second line 106 and the OD terminal 31, and the third diode 43 is disposed in the forward direction between the third line 107 and the fifth line 109.

According to the above, it is possible to provide the ESD protection circuit 207 which can be applied even when the protection target circuit 80 has the plurality of N-channel open drain terminals.

Further, unlike the circuit configuration shown in FIG. 13 which requires the corresponding number of the ESD protection circuits 200 to the number of the N-channel open drain terminals, it is sufficient for the number of the ESD protection circuits 200 to be one even when the number of the N-channel open drain terminals increases, and therefore, it is possible to reduce the circuit size.

Further, by disposed the first diode 41 between the OD terminal 31 and the fifth line 109, the parasitic capacitance to be coupled to the OD terminal 31 decreases, and therefore it is possible to prevent a decrease in response speed and an increase in current consumption when performing switching.

Further, since the third diode 43 is disposed between the fifth line 109 as the common electrode line and the third line 107 as an output of the constant-voltage circuit 82, it is possible to reduce the current consumption when charging or discharging the parasitic capacitance of the fifth line 109 due to the external noise and a negative surge current when performing switching.

Further, according to the ESD protection circuit 208 related to the present embodiment, the following advantages can be obtained in addition to the advantages in Embodiment 1.

The ESD protection circuit 208 is provided with the ESD protection circuit 203, the first diode 41 is disposed in the forward direction between the fifth line 109 for supplying the fifth potential as a potential lower than the first potential and the OD terminal 33, the second diode 42 is disposed in the forward direction between the OD terminal 33 and the first line 105, and the third diode 43 is disposed in the forward direction between the fifth line 109 and the third line 107.

According to the above, it is possible to provide the ESD protection circuit 208 which can be applied even when the protection target circuit 80 has the plurality of P-channel open drain terminals.

Further, unlike the circuit configuration shown in FIG. 13 which requires the corresponding number of the ESD protection circuits 200 to the number of the open drain terminals, it is sufficient for the number of the ESD protection circuits 203 to be one even when the number of the P-channel open drain terminals increases, and therefore, it is possible to reduce the circuit size.

Further, by disposed the first diode 41 between the fifth line 109 and the OD terminal 33, the parasitic capacitance to be coupled to the OD terminal 33 decreases, and therefore it is possible to prevent a decrease in response speed and an increase in current consumption when performing switching.

Further, since the third diode 43 is disposed between the fifth line 109 as the common electrode line and the third line 107 as an output of the constant-voltage circuit 82, it is possible to reduce the current consumption when charging or discharging the parasitic capacitance of the fifth line 109 due to the external noise and a negative surge current when performing switching.

Embodiment 5

Different Aspect of ESD Protection Circuit—4

Figure 15:
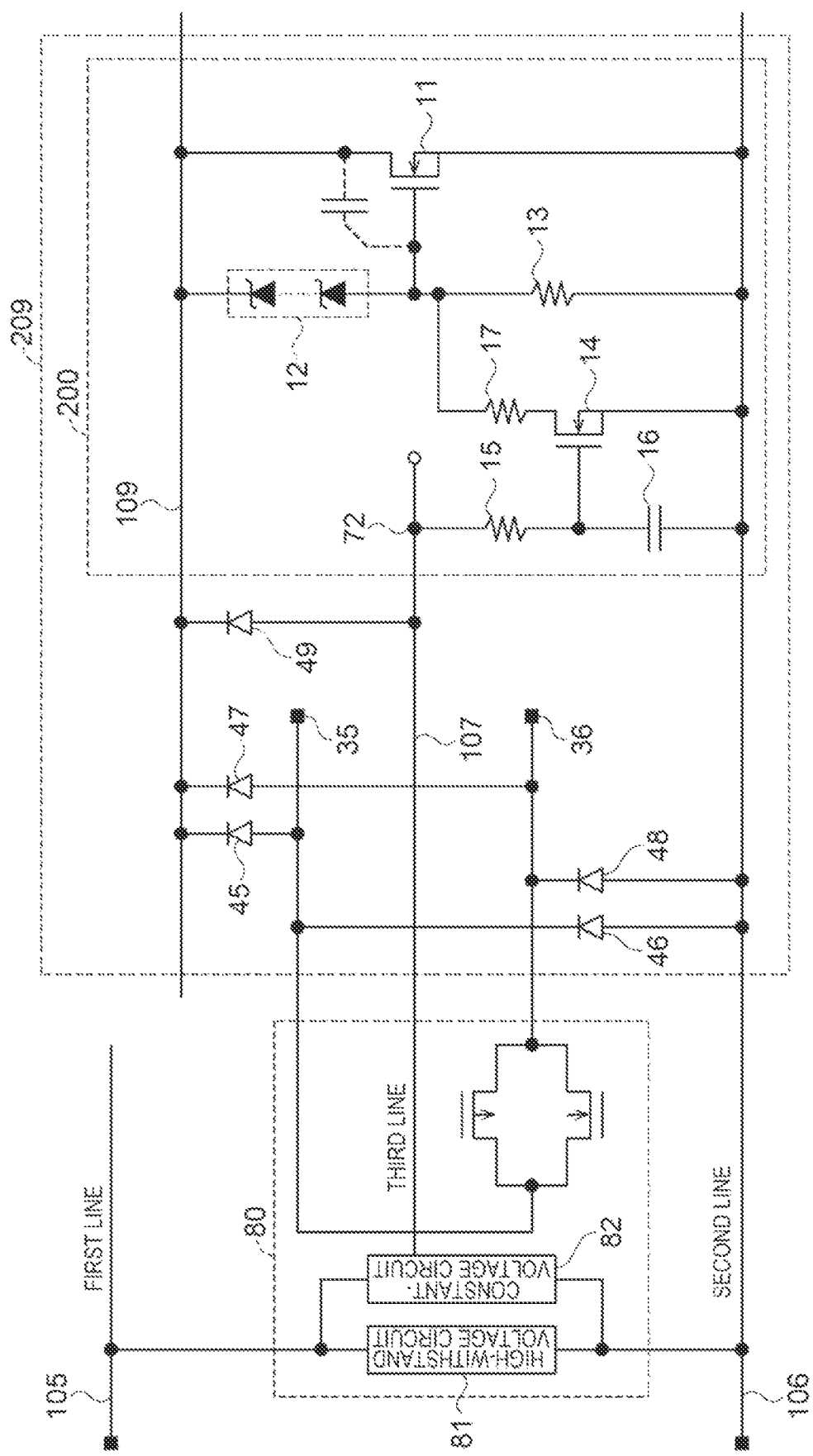
FIG. 15 is a circuit diagram of an ESD protection circuit according to Embodiment 5.

FIG. 15 is a circuit diagram of an ESD protection circuit according to the present embodiment, and corresponds to FIG. 1 and FIG. 12.

The ESD protection circuit described above can also be applied to a transmission gate terminal provided to the protection target circuit. Hereinafter, the same constituent regions as in the embodiments described above are denoted by the same reference numerals, and redundant descriptions will be omitted.

The protection target circuit 80 has a first terminal 35 and a second terminal 36 with the transmission gate. The fifth line 109 is the common electrode line for supplying the fifth potential as a potential higher than the second potential of the second line 106.

The ESD protection circuit 209 according to the present embodiment is provided with a single ESD protection circuit 200, and the high-potential line of the ESD protection circuit 200 is coupled to the fifth line 109.

Further, the ESD protection circuit 209 is further provided with a fourth diode 45 disposed in a forward direction between the first terminal 35 and the fifth line 109, a fifth diode 46 disposed in a forward direction between the second line 106 and the first terminal 35, a sixth diode 47 disposed in a forward direction between the second terminal 36 and the fifth line 109, a seventh diode 48 disposed in a forward direction between the second line 106 and the second terminal 36, and an eighth diode 49 disposed in a forward direction between the third line 107 and the fifth line 109.

It should be noted that the "forward direction" described above means that the anode and the cathode of the fourth diode 45 are respectively coupled to the first terminal 35 and the fifth line 109, the anode and the cathode of the fifth diode 46 are respectively coupled to the second line 106 and the first terminal 35, the anode and the cathode of the sixth diode 47 are respectively coupled to the second terminal 36 and the fifth line 109, the anode and the cathode of the seventh diode 48 are respectively coupled to the second line 106 and the second terminal 36, and the anode and the cathode of the eighth diode 49 are respectively coupled to the third line 107 and the fifth line 109.

As described hereinabove, according to the ESD protection circuit 209 related to the present embodiment, the following advantages can be obtained in addition to the advantages in Embodiment 1.

The ESD protection circuit 209 is provided with the ESD protection circuit 200, and is further provided with the fourth diode 45 disposed in the forward direction between the first terminal 35 and the fifth line 109, the fifth diode 46 disposed in the forward direction between the second line 106 and the first terminal 35, the sixth diode 47 disposed in the forward direction between the second terminal 36 and the fifth line 109, the seventh diode 48 disposed in the forward direction between the second line 106 and the second terminal 36, and the eighth diode 49 disposed in the forward direction between the third line 107 and the fifth line 109.

According to the above, it is possible to provide the ESD protection circuit 209 which can be applied even when the protection target circuit 80 has the transmission gate terminal.

Further, since it is sufficient for the number of the ESD protection circuits 200 to be one even when the number of the transmission gate terminals increases, it is possible to reduce the circuit size.

Embodiment 6

Semiconductor Device and Electronic Device

Figure 16:
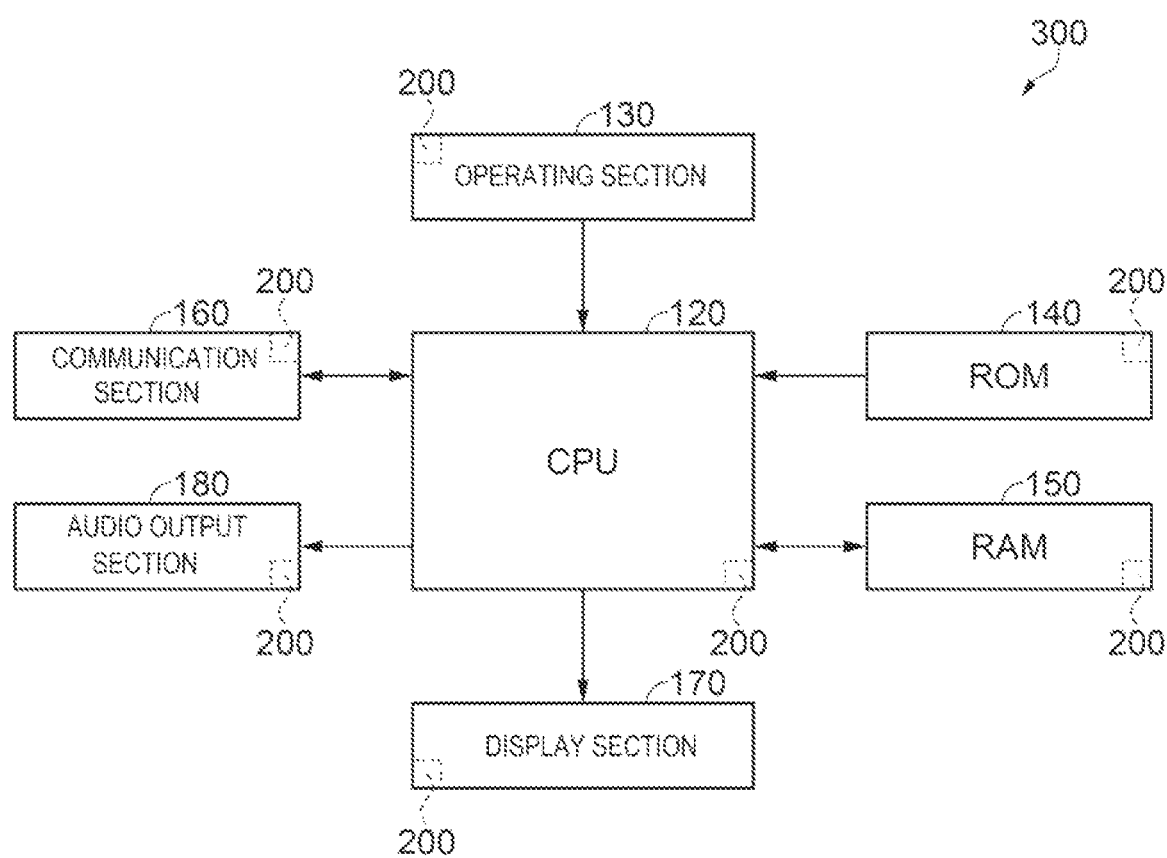
FIG. 16 is a schematic configuration diagram of an electronic apparatus according to Embodiment 6.

FIG. 16 is a schematic configuration diagram of an electronic apparatus according to the present embodiment.

The electronic apparatus 300 according to the present embodiment is, for example, a personal computer, and is constituted by a CPU 120, an operating section 130, a ROM 140, a RAM 150, a communication section 160, a display section 170, an audio output section 180, and so on as a semiconductor device as shown in FIG. 16. It should be noted that the CPU 120 is a central processing unit, the ROM 140 is a read-only memory, and the RAM 150 is a random access memory.

Here, the ESD protection circuit 200 according to the embodiment described above is installed in at least a part of the CPU 120, the ROM 140, the RAM 150, the communication section 160, the display section 170, and the audio output section 180. It should be noted that the ESD protection circuit 200 is illustrated as a representative in FIG. 16, but it is sufficient to install any of the ESD protection circuits 200 through 208. In other words, a semiconductor device constituting the CPU 120, the ROM 140, the RAM 150, the communication section 160, the display section 170, and the audio output section 180 corresponds to the protection target circuit 80 in the embodiment described above, and is provided with any of the ESD protection circuits 200 through 208 according to the embodiments described above.

Therefore, it is possible to protect the semiconductor device constituting the CPU 120, the operating section 130, the ROM 140, the RAM 150, the communication section 160, the display section 170, and the audio output section 180 from static electricity, an abnormal signal, and so on. Therefore, it is possible to provide the electronic apparatus 300 excellent in noise tolerance, and high in ESD breakdown voltage performance.

It should be noted that it is also possible to eliminate or modify some of the constituents shown in FIG. 16 or to add other constituents to the constituents shown in FIG. 16. The CPU 120 performs a variety of types of signal processing and control processing using data and so on supplied from the outside in accordance with the program stored in the ROM 140 and so on. For example, the CPU 120 performs a variety of types of signal processing in accordance with an operation signal supplied from the operating section 130, controls the communication section 160 for performing data communication with the outside, generates an image signal for making the display section 170 display a variety of images, and generates an audio signal for making the audio output section 180 output a variety of types of sounds.

The operating section 130 is an input device including, for example, operation keys and button switches, and outputs the operation signal corresponding to the operation by the user to the CPU 120. The ROM 140 stores programs, data, and so on for the CPU 120 to perform the variety of types of signal processing and control processing. The RAM 150 is used as a working area of the CPU 120, and temporarily stores the programs and the data retrieved from the ROM 140, data input using the operating section 130, a result of an arithmetic operation performed by the CPU 120 in accordance with the program, or the like.

The communication section 160 is constituted by, for example, an analog circuit and a digital circuit, and performs the data communication between the CPU 120 and an external device. The display section 170 includes, for example, an LCD, and displays a variety of images based on the image signal supplied from the CPU 120. The LCD means a liquid crystal display.

The audio output section 180 includes, for example, a speaker, and outputs a sound based on the sound signal supplied from the CPU 120.

As such an electronic apparatus 300, there can be cited, for example, a timepiece such as a watch or a table clock, a timer, a mobile terminal such as a cellular phone, a digital still camera, a digital movie, a television set, a video phone, a security video monitor, a head-mounted display, a smartphone, a printer, networking equipment, a complex machine, an in-car device, an electronic calculator, an electronic dictionary, an electronic gaming machine, a robot, a measuring instrument, and medical equipment.

What is claimed is:

1. An ESD protection circuit which is disposed between a first line configured to supply a first potential and a second line configured to supply a second potential different from the first potential, and protects a protection target circuit from a surge voltage, the ESD protection circuit comprising:
- a power MOS transistor disposed between the first line and the second line;
- a clamp circuit disposed between the first line and a first node to which a gate of the power MOS transistor is coupled;
- a first resistor disposed between the first node and the second line;
- a MOS transistor disposed between the first node and the second line;
- a third line supplied with a third potential generated by a constant-voltage circuit of the protection target circuit; and
- a second resistor and a first capacitor coupled in series between a second node coupled to the third line and the second line, wherein
- when defining a junction between the second resistor and the first capacitor as a third node, a gate of the MOS transistor is coupled to the third node, and
- the third potential is a potential between the first potential and the second potential.

2. The ESD protection circuit according to claim 1, wherein
an ON resistance of the MOS transistor is no lower than 500Ω and no higher than 2 kΩ.

3. The ESD protection circuit according to claim 1, further comprising:
a third resistor disposed between the first node and a drain of the MOS transistor.

4. The ESD protection circuit according to claim 1, further comprising:
- a fourth resistor disposed between the first node and the first resistor, wherein
- when defining a junction between the first resistor and the fourth resistor as a fourth node, the MOS transistor is disposed between the fourth node and the second line.

5. The ESD protection circuit according to claim 1, further comprising:
- a second power MOS transistor which is different in polarity from the power MOS transistor defined as a first power MOS transistor, and is disposed between the first line and the first power MOS transistor; and
- a fifth resistor disposed between the first line and a fifth node at which a gate of the second power MOS transistor is coupled to one end of the clamp circuit.

6. The ESD protection circuit according to claim 5, further comprising:
- a second MOS transistor disposed between the fifth node and the first line defining the MOS transistor as a first MOS transistor;
- a sixth resistor disposed between the fifth node and the second MOS transistor;
- a fourth line supplied with a fourth potential different from the third potential; and
- a seventh resistor and a second capacitor coupled in series between a sixth node coupled to the fourth line and the first line, wherein
- when defining a junction between the seventh resistor and the second capacitor as a seventh node, a gate of the second MOS transistor is coupled to the seventh node, and the fourth potential is a potential between the first potential and the second potential.

7. The ESD protection circuit according to claim 1, further comprising:
- a first diode which is disposed between an N-channel open drain terminal provided to the protection target circuit and a fifth line configured to supply a fifth potential as a potential higher than the second potential, and an anode and a cathode of which are coupled respectively to the N-channel open drain terminal and the fifth line;
- a second diode which is disposed between the second line and the N-channel open drain terminal, and an anode and a cathode of which are coupled respectively to the second line and the N-channel open drain terminal; and
- a third diode which is disposed between the third line and the fifth line, and an anode and a cathode of which are coupled respectively to the third line and the fifth line.

8. The ESD protection circuit according to claim 1, further comprising:
- a first diode which is disposed between a P-channel open drain terminal provided to the protection target circuit and a fifth line configured to supply a fifth potential as a potential lower than the first potential, and an anode and a cathode of which are coupled respectively to the fifth line and the P-channel open drain terminal;
- a second diode which is disposed between the P-channel open drain terminal and the first line, and an anode and a cathode of which are coupled respectively to the P-channel open drain terminal and the first line; and
- a third diode which is disposed between the fifth line and the third line, and an anode and a cathode of which are coupled respectively to the fifth line and the third line.

9. The ESD protection circuit according to claim 1, further comprising:
- a fourth diode which is disposed between a first terminal of the protection target circuit and a fifth line configured to supply a fifth potential as a potential higher than the second potential, and an anode and a cathode of which are coupled respectively to the first terminal and the fifth line, the protection target circuit having the first terminal and a second terminal with a transmission gate;
- a fifth diode which is disposed between the second line and the first terminal, and an anode and a cathode of which are coupled respectively to the second line and the first terminal;
- a sixth diode which is disposed between the second terminal and the fifth line, and an anode and a cathode of which are coupled respectively to the second terminal and the fifth line;
- a seventh diode which is disposed between the second line and the second terminal, and an anode and a cathode of which are coupled respectively to the second line and the second terminal; and
- an eighth diode which is disposed between the third line and the fifth line, and an anode and a cathode of which are coupled respectively to the third line and the fifth line.

10. A semiconductor device comprising:
the ESD protection circuit according to claim 1.

11. An electronic apparatus comprising:
the semiconductor device according to claim 10.

* * * * *